United States Patent
Asao

(10) Patent No.: US 11,756,617 B2
(45) Date of Patent: Sep. 12, 2023

(54) VARIABLE RESISTANCE MEMORY DEVICE

(71) Applicant: Kioxia Corporation, Tokyo (JP)

(72) Inventor: Yoshiaki Asao, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/961,433

(22) Filed: Oct. 6, 2022

(65) Prior Publication Data

US 2023/0032616 A1 Feb. 2, 2023

Related U.S. Application Data

(63) Continuation of application No. 17/349,162, filed on Jun. 16, 2021, now Pat. No. 11,495,295.

(30) Foreign Application Priority Data

Feb. 17, 2021 (JP) ................. 2021-023416

(51) Int. Cl.
  *G11C 11/00* (2006.01)
  *G11C 13/00* (2006.01)
  (Continued)

(52) U.S. Cl.
  CPC ........ *G11C 13/0069* (2013.01); *G11C 11/161* (2013.01); *G11C 13/004* (2013.01);
  (Continued)

(58) Field of Classification Search
  CPC .............. G11C 13/0069; G11C 11/161; G11C 13/0026; G11C 13/0028
  See application file for complete search history.

(56) References Cited

U.S. PATENT DOCUMENTS 7,983,065 B2 7/2011 Samachisa
9,715,916 B1 * 7/2017 Tomishima ......... G11C 11/1657
(Continued)

FOREIGN PATENT DOCUMENTS

JP      5469239 B2    2/2014
JP      6178451 B1    8/2017
JP    2019024082 A    2/2019

OTHER PUBLICATIONS

Noguchi, et al., "A 250-MHz 256b-I/O 1-Mb STT-MRAM with Advanced Perpendicular MTJ based Dual Cell for Nonvolatile Magnetic Caches to Reduce Active Power of Processors", 2013 Symposium on VLSI Technology, pp. C108-C109.

(Continued)

*Primary Examiner* — Vu A Le
(74) *Attorney, Agent, or Firm* — Holtz, Holtz & Volek PC

(57) ABSTRACT

A variable resistance memory device includes plural first, second, and third conductors, plural memory cells, and a write circuit. Each memory cell is between one first conductor and one third conductor, and includes a first sub memory cell and a second sub memory cell. The first sub memory cell is between the one first conductor and one second conductor, and includes a first variable resistance element and a first bidirectional switching element. The second sub memory cell is between the one second conductor and the one third conductor, and includes a second variable resistance element and a second bidirectional switching element. The write circuit applies a first potential to the first and third conductors of a selected memory cell, a second potential to the second conductor of the selected memory cell, and a third potential to the first and third conductors of non-selected memory cells.

9 Claims, 31 Drawing Sheets

(51) Int. Cl.
  *G11C 11/16* (2006.01)
  *H10N 70/20* (2023.01)
(52) U.S. Cl.
  CPC ...... *G11C 13/0026* (2013.01); *G11C 13/0028* (2013.01); *G11C 13/0064* (2013.01); *H10N 70/20* (2023.02); *G11C 2213/79* (2013.01)

(56) References Cited

U.S. PATENT DOCUMENTS

| | | | |
|---|---|---|---|
| 9,830,968 B2 | 11/2017 | Shimomura et al. | |
| 10,395,706 B2 | 8/2019 | Kim et al. | |
| 2005/0122757 A1* | 6/2005 | Moore | G11C 11/4097 257/E27.081 |
| 2005/0146932 A1* | 7/2005 | Lee | G11C 16/3468 365/185.05 |
| 2012/0099367 A1 | 4/2012 | Azuma et al. | |
| 2014/0056055 A1 | 2/2014 | Ikeda et al. | |
| 2014/0098594 A1 | 4/2014 | Azuma et al. | |
| 2018/0075903 A1 | 3/2018 | Ogiwara et al. | |
| 2019/0006422 A1 | 1/2019 | Park | |

OTHER PUBLICATIONS

Wei, et al., "A 7Mb STT-MRAM in 22FFL FinFET Technology with 4ns Read Sensing Time at 0.9V Using Write-Verify-Write Scheme and Offset-Cancellation Sensing Technique", 2019 IEEE International Solid-State Circuits Conference, pp. 214-216.

Woo, et al., "Comparative Study of Cross-Point MRAM Array With Exponential and Threshold Selectors for Read Operation", IEEE Electron Device Letters, vol. 39, No. 5, May 2018.

* cited by examiner

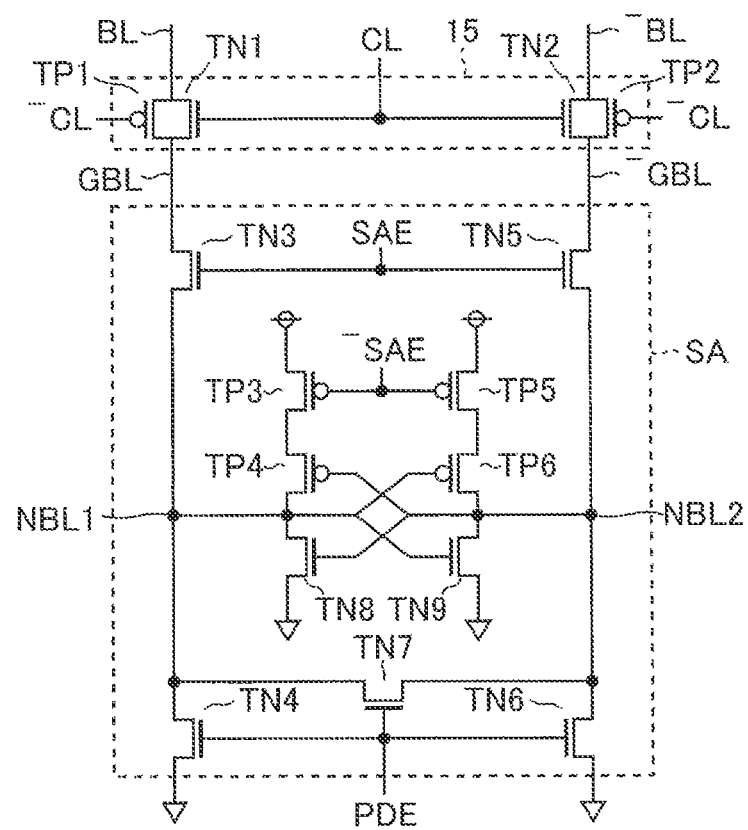
F I G. 9

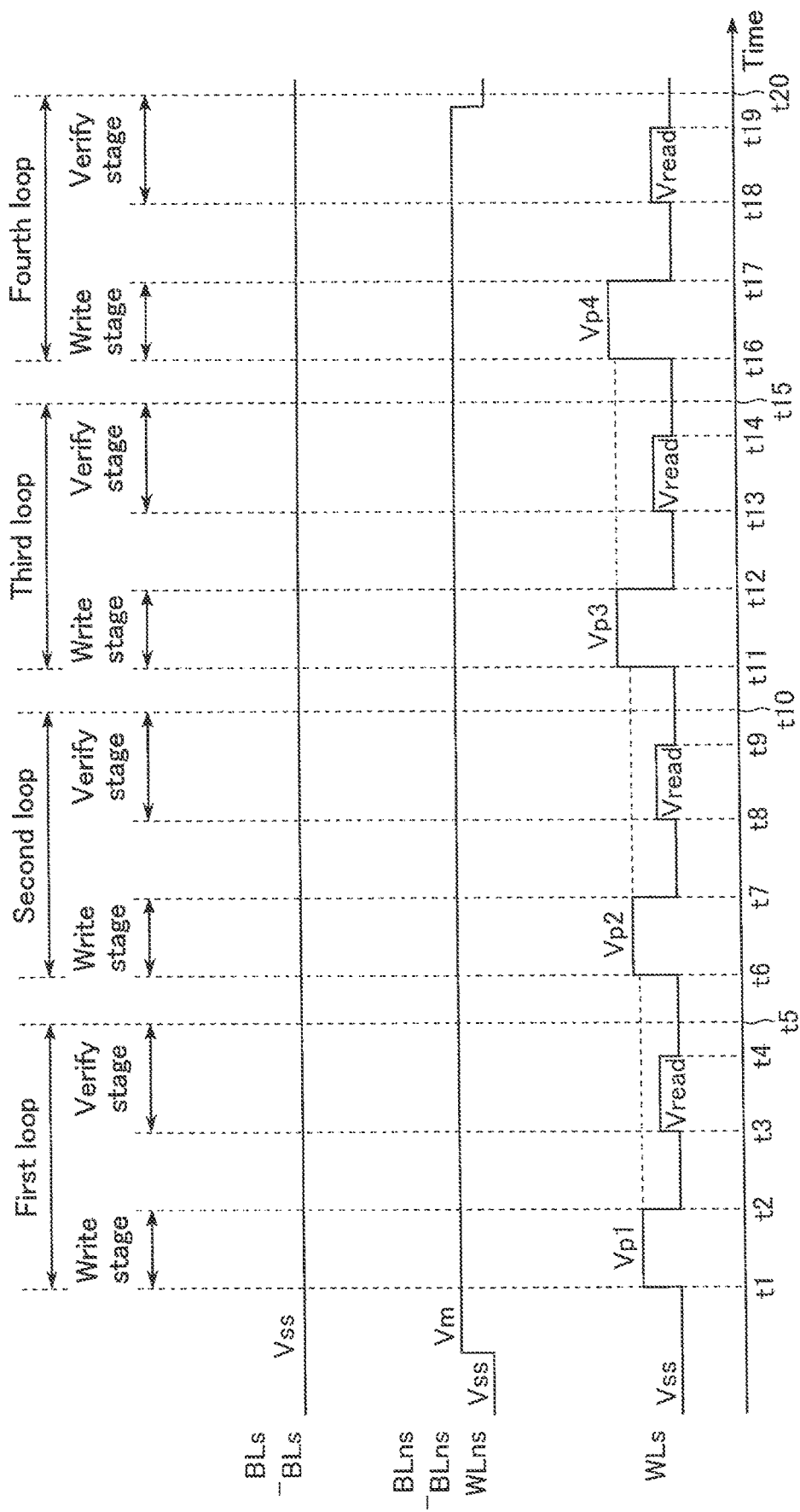
F I G. 17

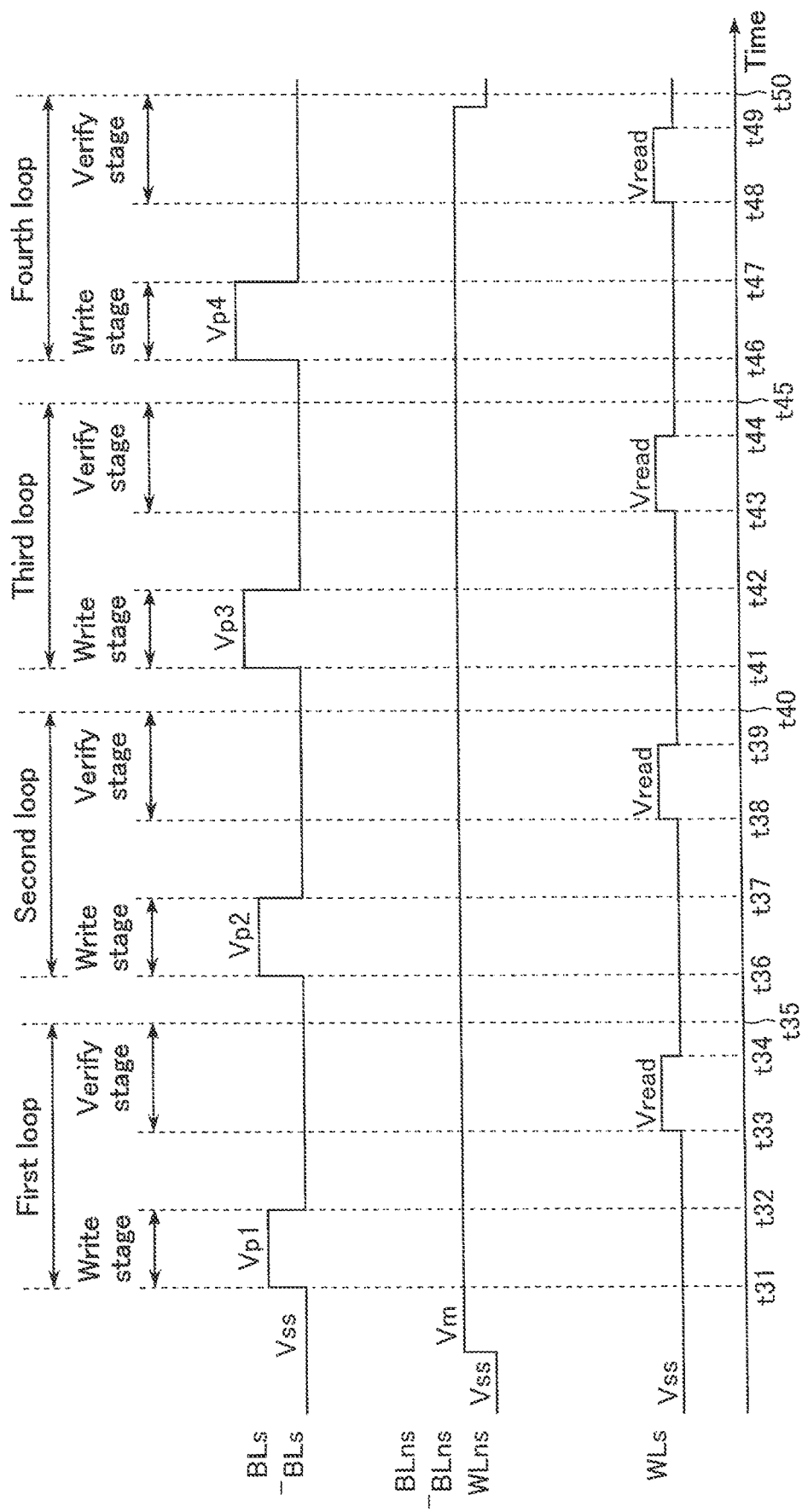
F I G. 18

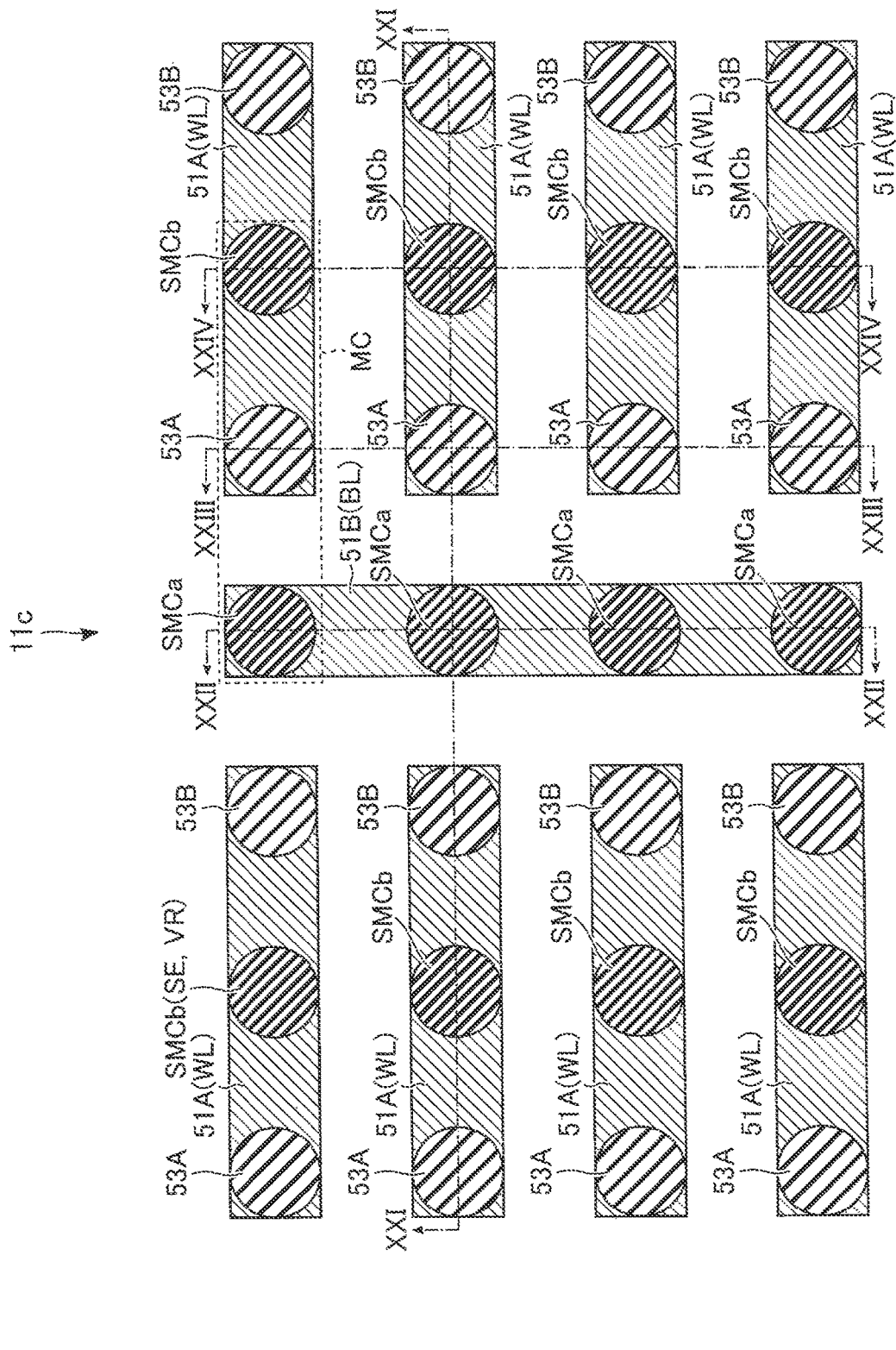
F I G. 19

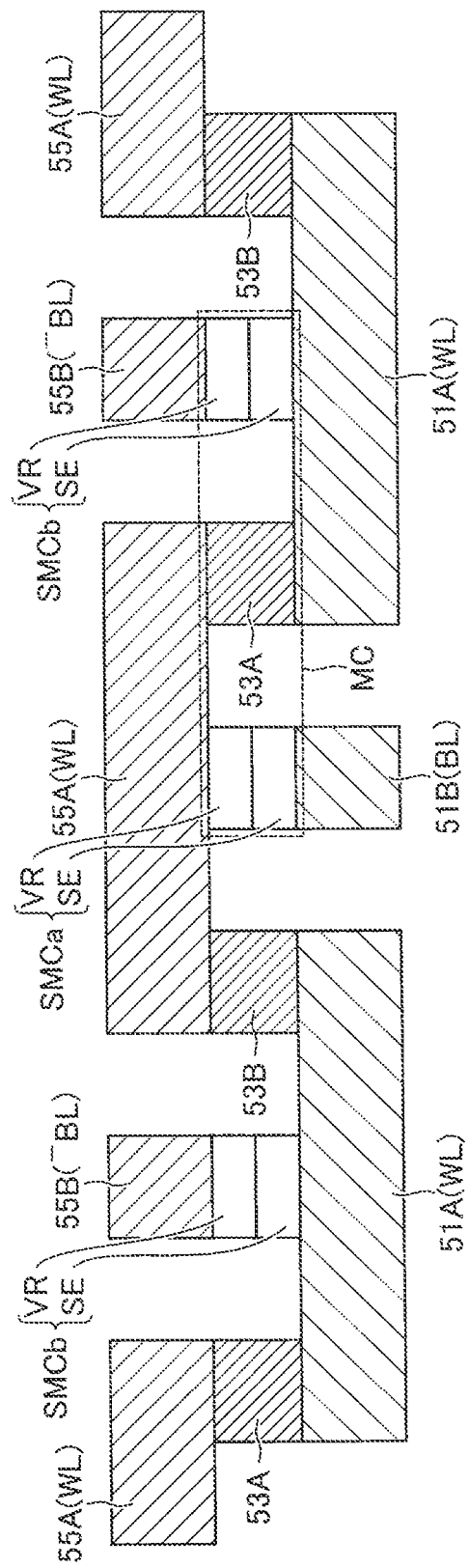
F I G. 21

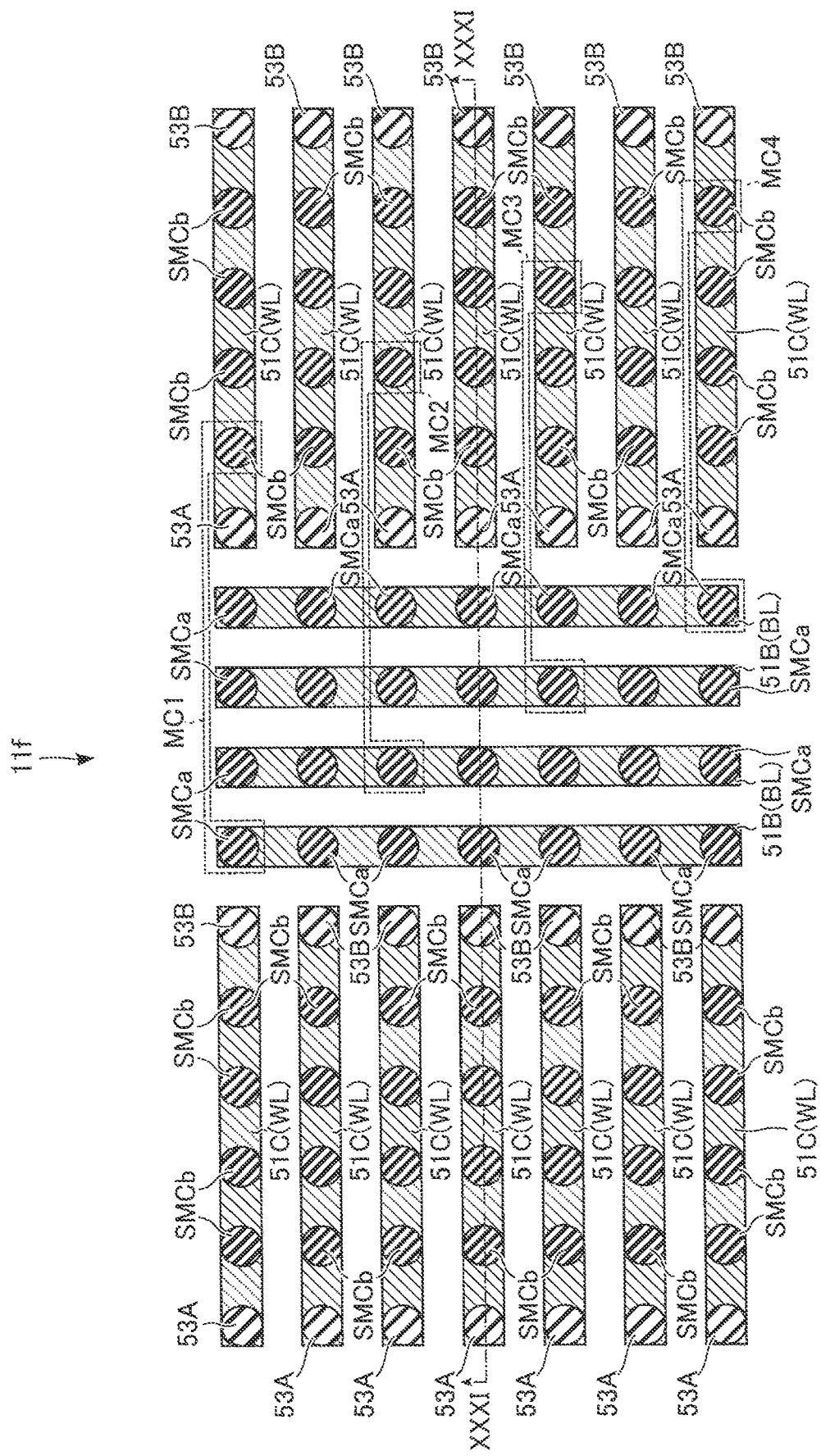
F I G. 29

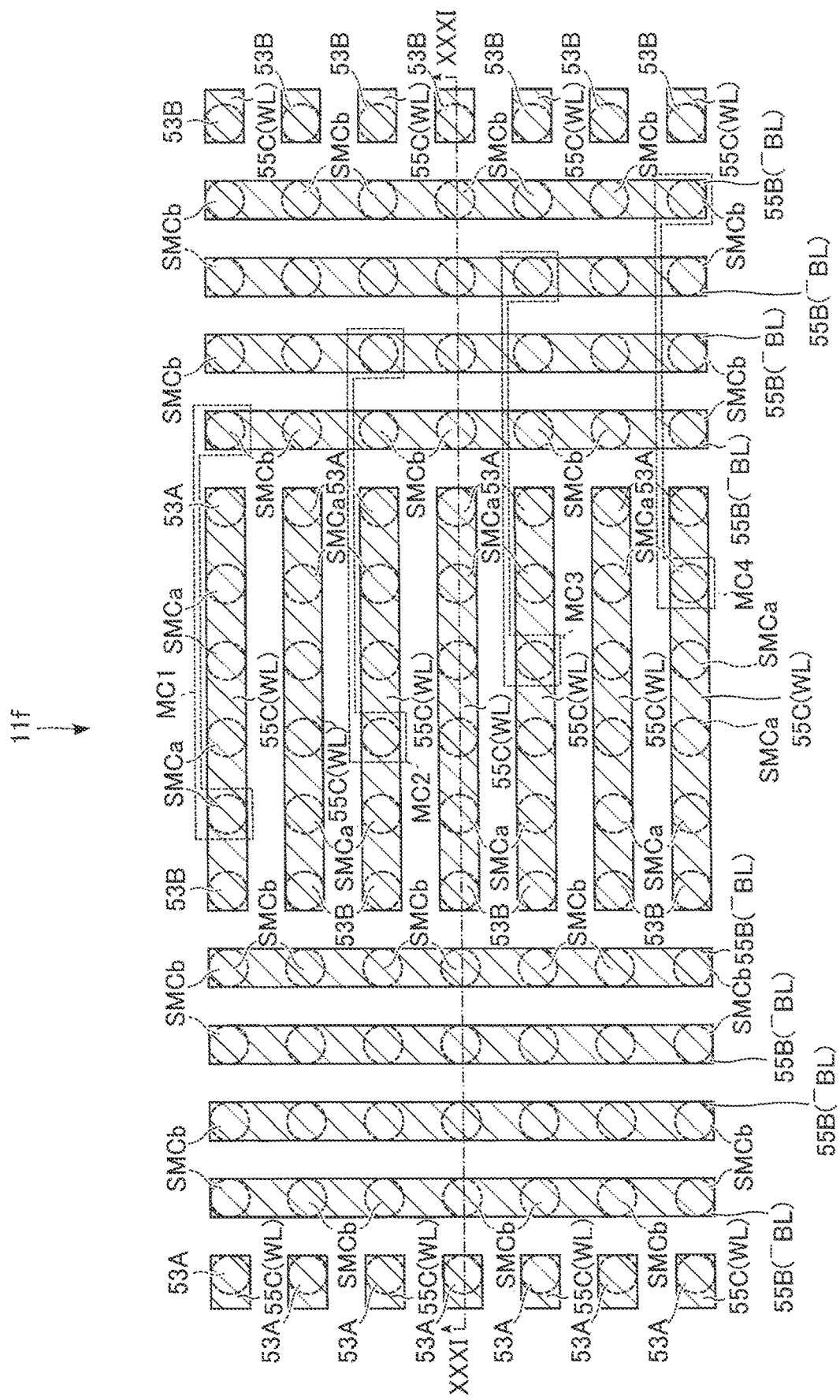
F I G. 30

VARIABLE RESISTANCE MEMORY DEVICE

CROSS-REFERENCE TO RELATED APPLICATIONS

This application is a Continuation Application of U.S. application Ser. No. 17/349,162, filed Jun. 16, 2021, which is based upon and claims the benefit of priority from prior Japanese Patent Application No. 2021-23416, filed Feb. 17, 2021, the entire contents of both of which are incorporated herein by reference.

FIELD

Embodiments described herein relate generally to a variable resistance memory device.

BACKGROUND

A variable resistance memory device is known as one type of memory device. The variable resistance memory device stores data, using an element having a dynamically variable resistance. The variable resistance memory device is required to have suppressed disturbance and/or a high degree of integration.

BRIEF DESCRIPTION OF THE DRAWINGS

FIG. 9 shows components of part of the read circuit of the first embodiment and part of a column selector, and also shows how the components are coupled.

FIG. 17 shows how the potentials of wirings are changed with time during data write performed in the second embodiment.

FIG. 18 shows how the potentials of wirings are changed with time during data write performed in the second embodiment.

FIG. 19 shows a partial plan structure of a memory cell array of a third embodiment.

FIG. 21 shows a partial cross-sectional structure of the memory cell array of the third embodiment.

FIG. 29 shows a partial plan structure of a memory cell array of a sixth embodiment.

FIG. 30 shows a partial plan structure of the memory cell array of the sixth embodiment.

DETAILED DESCRIPTION

Figure 1:
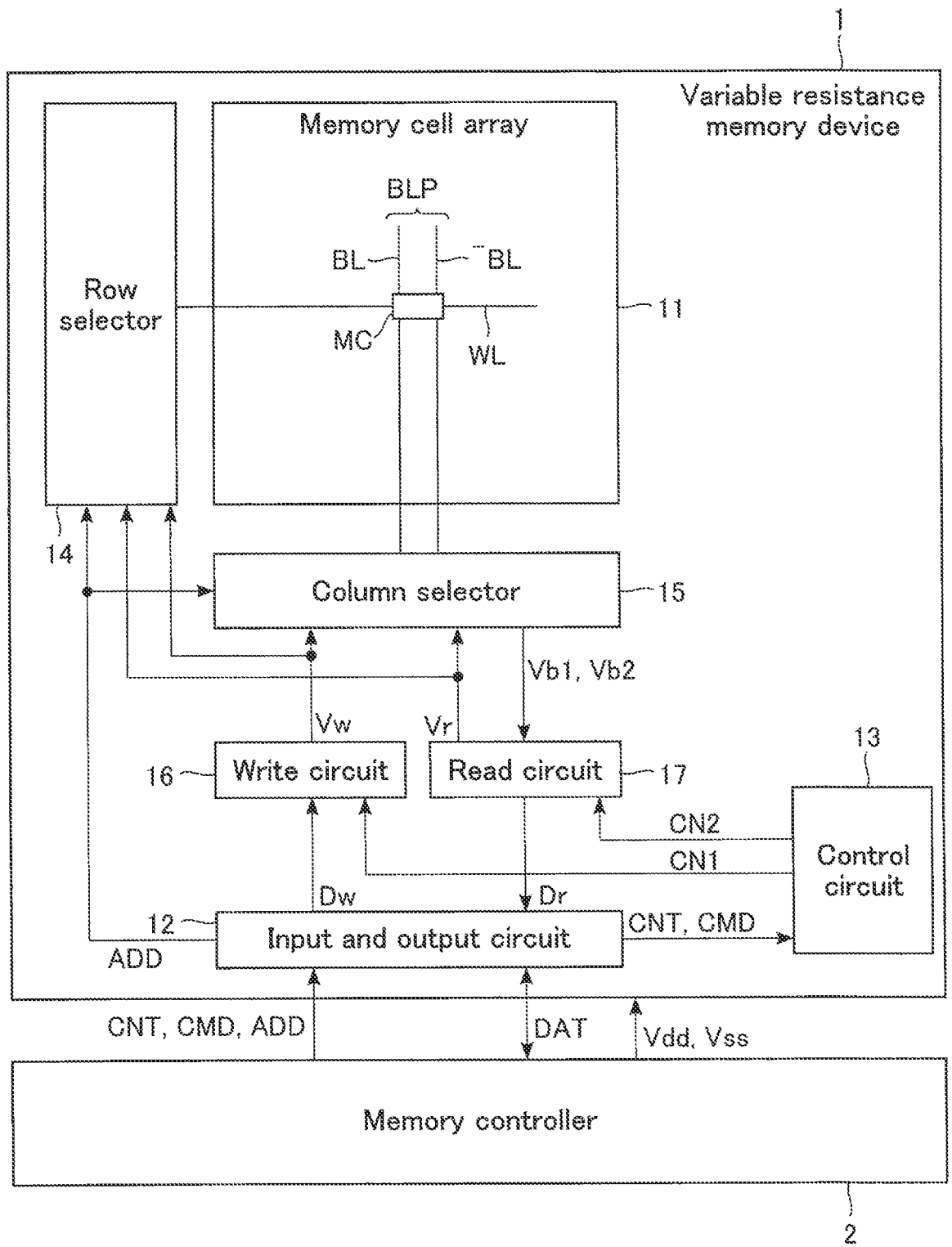
FIG. 1 shows functional blocks of a variable resistance memory device of a first embodiment.

In general, according to one embodiment, a variable resistance memory device includes: a memory cell; a first conductor; a second conductor; and a third conductor. The memory cell includes a first sub memory cell and a second sub memory cell. The first sub memory cell includes a first variable resistance element and a first bidirectional switching element. The second sub memory cell includes a second variable resistance element and a second bidirectional switching element. The first sub memory cell is above the first conductor. The second conductor is above the first sub memory cell. The second sub memory cell is above the second conductor. The third conductor is above the second sub memory cell. The variable resistance memory device is configured to receive first data and to write the first data to the memory cell when the first data does not match second data read from the memory cell.

Embodiments will now be described with reference to the figures.

In the following description, components with substantially the same functionalities and configurations will be referred to with the same reference numerals. In order to distinguish components having substantially the same function and configuration from each other, an additional numeral or letter may be added to the end of each reference numeral.

The figures are schematic, and the relation between the thickness and the area of a plane of a layer and the ratio of thicknesses of layers may differ from the actual ones. The figures may include components which differ in relations and/or ratios of dimensions in different figures. Moreover, the entire description for a particular embodiment also applies to other embodiments unless explicitly mentioned otherwise or obviously eliminated.

It is not necessary that functional blocks are distinguished as in the following examples. For example, some of the functions may be implemented by functional blocks different from those illustrated below. Furthermore, an illustrated functional block may be divided into functional sub blocks. In the specification and the claims, a phrase of a particular first component being "coupled" to another second component includes the first component being coupled to the second component either directly or via one or more components which are always or selectively conductive.

The embodiments will be described by using an xyz orthogonal coordinate system.

1. First Embodiment

1.1. Configuration (Structure)

1.1.1. Overall Configuration

FIG. 1 shows functional blocks of the variable resistance memory device of the first embodiment. FIG. 1 shows a memory controller as well.

As shown in FIG. 1, the variable resistance memory device 1 is controlled by the memory controller 2. The variable resistance memory device 1 receives a power supply potential Vdd and a ground potential (or, common potential) Vss externally of the variable resistance memory device 1. The variable resistance memory device 1 receives the power supply potential Vdd and the ground potential Vss, for example, from the memory controller 2. The ground potential Vss is, for example, 0V. The variable resistance memory device 1 uses the power supply potential Vdd and the ground potential Vss, and operates under the control of the memory controller 2.

The variable resistance memory device 1 includes a memory cell array 11, an input and output circuit 12, a control circuit 13, a column selector 15, a write circuit 16 and a read circuit 17.

The memory cell array 11 includes a plurality of memory cells MC, a plurality of word lines WL, a plurality of bit lines BL and a plurality of bit lines BL. The memory cell MC can store data in a nonvolatile manner. Each memory cell MC is coupled to a single word line WL and a single bit line pair BLP. Each bit line pair BLP consists of bit line BL and bit line BL. The word line WL is associated with a row. The bit line pair BLP is associated with a column. By selecting a single row and a single column, one or a plurality of memory cells MC are identified.

The input and output circuit 12 receives a control signal CNT, a command CMD, an address signal ADD and data DAT from the memory controller 2. The input and output circuit 12 transmits the data DAT to the memory controller 2. The data DAT is write data in the case of data write to the variable resistance memory device 1. The data DAT is read data in the case of data read from the variable resistance memory device 1.

The control circuit 13 receives the control signal CNT and the command CMD from the input and output circuit 12. The control circuit 13 controls the write circuit 16, based on the control indicated by the control signal CNT and the command CMD. Specifically, the control circuit 13 transmits a control signal CN1 to the write circuit 16 and controls the write circuit 16, using the control signal CN1. The control signal CN1 may include a plurality of different control signals.

The control circuit 13 controls the read circuit 17, based on the control indicated by the control signal CNT and the command CMD. Specifically, the control circuit 13 transmits a control signal CN2 to the read circuit 17, and controls the read circuit 17, using the control signal CN2. The control signal CN2 may include a plurality of different control signals.

The write circuit 16 performs processing and control for data write to the memory cell MC. The write circuit 16 receives the power supply potential Vdd and the ground potential Vss. The write circuit 16 receives write data Dw from the input and output circuit 12. The write data Dw is data to be written to a memory cell MC that is a data write target. The write circuit 16 uses the power supply potential Vdd and the ground potential Vss to generate a plurality of potentials used in data write. The plurality of potentials used in data write have various magnitudes. The plurality of potentials used in data write are referred to as write potentials Vw. The write circuit 16 receives the control signal CN1 and the write data Dw. The write circuit 16 supplies one or more of the write potentials Vw to a row selector (or, row selector circuit) 14 and the column selector 15 (or, column selector circuit), based on the control signal CN1 and the write data Dw.

The read circuit 17 performs processing and control for data read from the memory cell MC. The read circuit 17 receives the power supply potential Vdd and the ground potential Vss. The read circuit 17 uses the power supply potential Vdd and the ground potential Vss to generate a plurality of potentials used for data read. The plurality of potentials used in data read have various magnitudes. The plurality of potentials used in data read are referred to as read potentials Vr. The read circuit 17 receives the control signal CN2. The read circuit 17 supplies one or more of the read potentials Vr to the row selector 14 and the column selector 15, based on the control signal CN2.

The read circuit 17 includes one or more sense amplifiers. The read circuit 17 is coupled to a single bit line pair BLP coupled to the memory cell MC to be read, by the control signal CN2 and the column selector 15. The read circuit 17 receives potentials Vb1 and Vb2 of the bit lines BL and ―BL of the coupled bit line pair BLP. The read circuit 17 uses a sense amplifier to determine the data stored in the memory cell MC which is the read target, based on the potentials Vb1 and Vb2. The determined data is supplied to the input and output circuit 12 as read data Dr.

The row selector 14 receives a write potential Vw from the write circuit 16. The row selector 14 receives a read potential Vr from the read circuit 17. The row selector 14 receives the address signal ADD from the input and output circuit 12. The row selector 14 applies a write potential Vw to a single word line WL associated with the row identified by the received address signal ADD. The row selector 14 applies another write potential Vw to a word line WL other than the word line WL associated with the row identified by the received address signal ADD. The row selector 14 applies a read potential Vr to a single word line WL associated with the row identified by the received address signal ADD. The row selector 14 applies another read potential Vr to a word line WL other than the word line WL associated with the row identified by the received address signal ADD.

The column selector 15 receives a write potential Vw from the write circuit 16. The column selector 15 receives a read potential Vr from the read circuit 17. The column selector 15 receives an address signal ADD from the input and output circuit 12. The column selector 15 applies a write potential Vw based on the write data Dw to a single bit line pair BLP associated with the column identified by the received address signal ADD. The column selector 15 applies another write potential Vw to a bit line pair BLP other than the bit line pair BLP associated with the column identified by the received address signal ADD. The column selector 15 applies a read potential Vr to a single bit line pair BLP associated with the column identified by the received address signal ADD. The column selector 15 applies another read potential Vr to a bit line pair BLP other than the bit line pair BLP associated with the column identified by the received address signal ADD.

1.1.2. Circuit Configuration of Memory Cell Array

Figure 2:
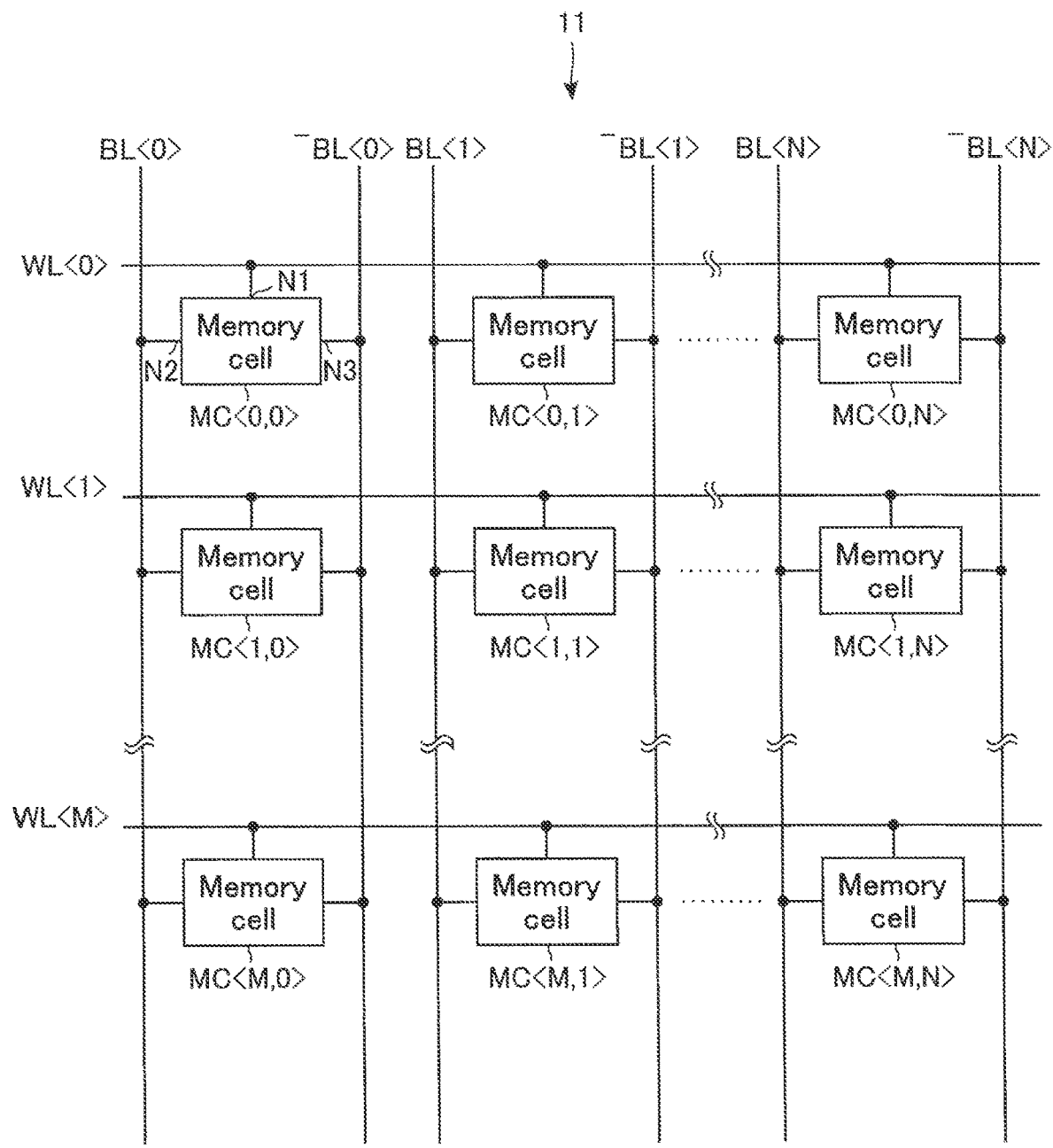
FIG. 2 is a circuit diagram of a memory cell array of the first embodiment.

FIG. 2 is a circuit diagram of a memory cell array 11 of the first embodiment. As shown in FIG. 2, the memory cell array 11 includes M+1 (M is a natural number) word lines WL (WL<0>, WL<1>, . . . , WL<M>). The memory cell array 11 also includes N+1 (N is a natural number) bit lines BL (BL <0>, BL<1>, . . . , BL<N>) and N+1 bit lines ⎺BL (⎺BL<0>, ⎺BL<1>, . . . , ⎺BL<N>).

Each memory cell MC is coupled to a single bit line pair BLP and a single word line WL. Each memory cell MC includes a first node N1, a second node N2 and a third node N3. Each memory cell MC is coupled to a word line WL at its first node N1. Each memory cell MC is coupled to a bit line BL of the bit line pair BLP at its second node N2. Each memory cell MC is coupled to a bit line ⎺BL of the bit line pair BLP at its third node N3. A more specific description of this will be given. The memory cell MC includes memory cells MC<$\alpha,\beta$> for all combinations of all cases where $\alpha$ is not less than 0 and not more than M and all cases where $\beta$ is not less than 0 and not more than N. The memory cell MC<$\alpha,\beta$> is coupled to a word line WL<$\alpha$> at its first node N1 for all combinations of all cases where $\alpha$ is not less than 0 and not more than M and all cases where $\beta$ is not less than 0 and not more than N. The memory cell MC <$\alpha,\beta$> is coupled to a bit lines BL <$\beta$> at its second node N2 for all combinations of all cases where $\alpha$ is not less than 0 and not more than M and all cases where $\beta$ is not less than 0 and not more than N. The memory cell MC <$\alpha,\beta$> is coupled to a bit line ⎺BL<$\beta$> at its third node N3 for all combinations of all cases where $\alpha$ is not less than 0 and not more than M and all cases where $\beta$ is not less than 0 and not more than N.

1.1.3. Circuit Configuration of Memory Cell

Figure 3:
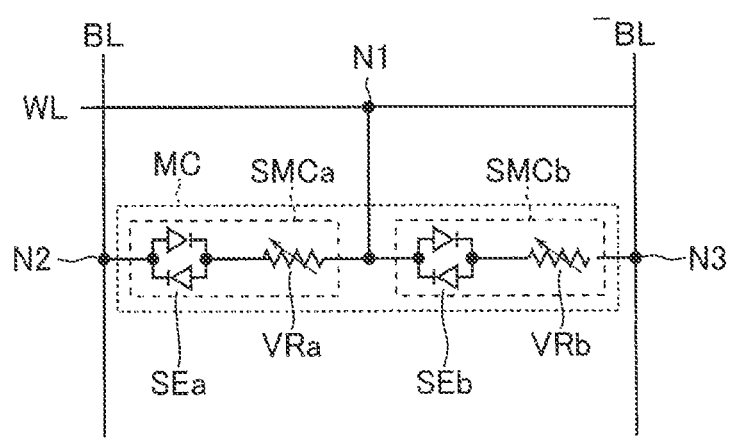
FIG. 3 is a circuit diagram of a memory cell of the first embodiment.

FIG. 3 is a circuit diagram of a memory cell MC of the first embodiment. As shown in FIG. 3, each memory cell MC includes two sub memory cells SMC. One sub memory cell SMC may be referred to as a first sub memory cell SMCa, and the other sub memory cell SMC may be referred to as a second sub memory cell SMCb. Each of the first sub memory cell SMCa and the second sub memory cell SMCb includes one variable resistance element VR (VRa or VRb) and one selector SE (SEa or SEb). Specifically, the first sub memory cell SMCa includes a single variable resistance element VRa and a single selector SEa, and the second sub memory cell SMCb includes a single variable resistance element VRb and a single selector SEb.

In each memory cell MC, the selector SEa, the variable resistance element VRa, the selector SEb and the variable resistance element VRb are coupled in series in the order mentioned. In each memory cell MC, the node to which the variable resistance element VRa and the selector SEb are coupled functions as a first node N1. In each memory cell MC, the end of the selector SEa opposite to the variable resistance element VRa functions as a second node N2. In each memory cell MC, the end of the variable resistance element VRb opposite to the selector SEb functions as a third node N3.

The variable resistance element VR can switch between a low resistance state and a high resistance state. The variable resistance element VR can store 1-bit data by utilizing the difference between these two resistance states.

The selector SE can be, for example, such a switching element as will be described below. The switching element has two terminals, and where a voltage lower than a first threshold is applied between the two terminals in the first direction, the switching element is in a high resistance state, for example, an electrically non-conducting state (or, an off state). On the other hand, where a voltage equal to or higher than the first threshold is applied between the two terminals in the first direction, the switching element is in a low resistance state, for example, an electrically conductive state (or, an on state). In the second direction opposite to the first direction, the switching element also has the same function of switching between the high resistance state and the low resistance state based on the magnitude of the voltage applied in the first direction. That is, the switching element is a bidirectional switching element, such as a bidirectional diode element. With the switching element turned on or off, whether or not a current should be supplied to the variable resistance element VR coupled to the switching element can be controlled, that is, whether the variable resistance element VR should be selected or left non-selected.

Each memory cell MC stores 1-bit data using the two variable resistance elements VRa and VRb of the memory cell MC. In each memory cell MC, the variable resistance elements VRa and VRb store 1-bit data complementary to each other. Each memory cell MC stores 1-bit data based on which of the variable resistance elements VRa and VRb stores "0" data.

The state in which either the variable resistance element VRa or VRb stores the "0" data may be regarded as the state in which the "0" data is stored in the memory cell MC. The description below is based on an example in which the variable resistance element VRa stores "0" data and the memory cell MC including this variable resistance element VRa stores "1" data. On the other hand, the state in which the variable resistance element VRb stores "0" data is regarded as a state in which the memory cell MC including this variable resistance element VRa stores "0" data.

1.1.4. Configuration of Memory Cell Array

Figure 4:
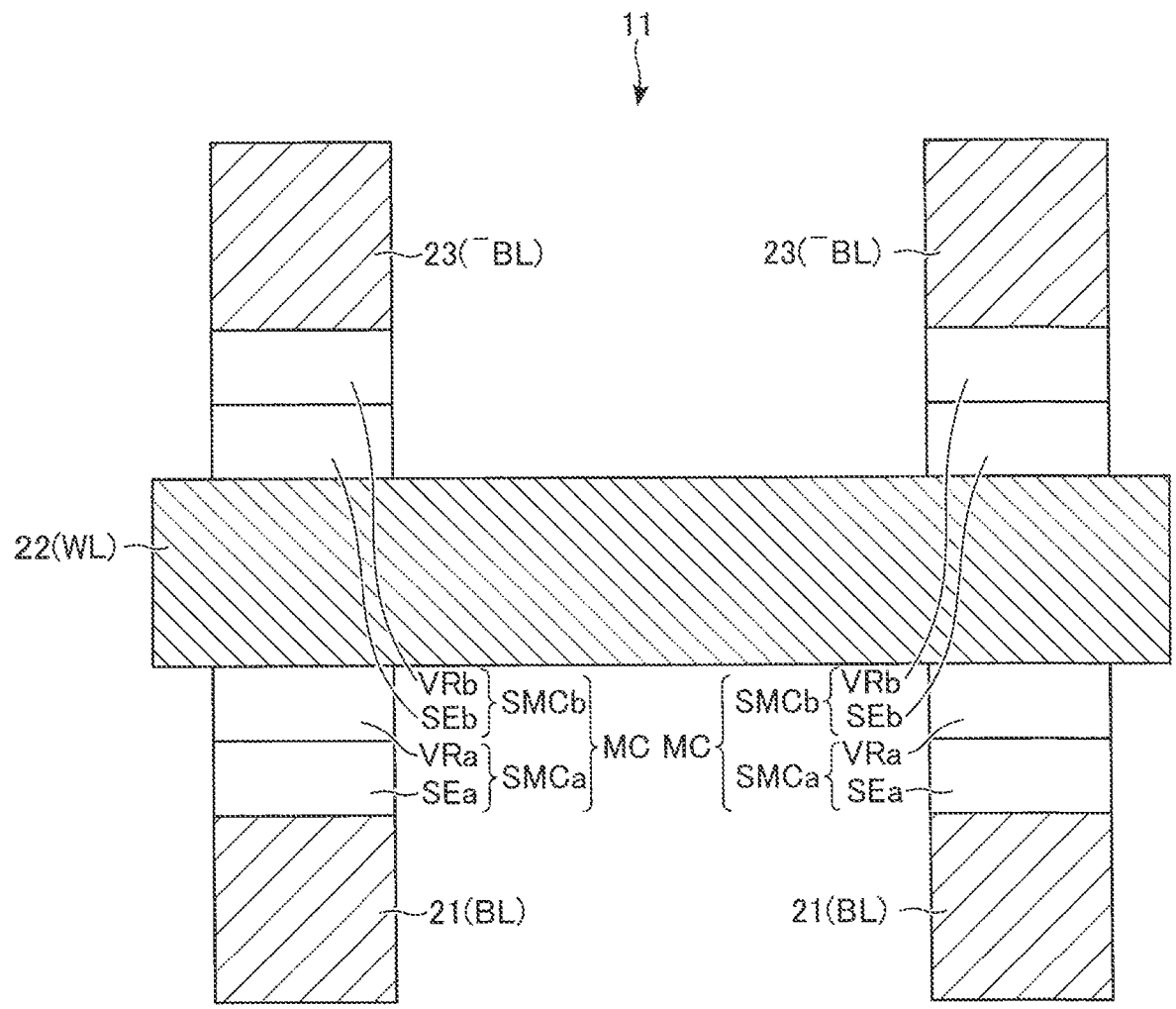
FIG. 4 shows a partial cross-sectional structure of the memory cell array of the first embodiment.
Figure 5:
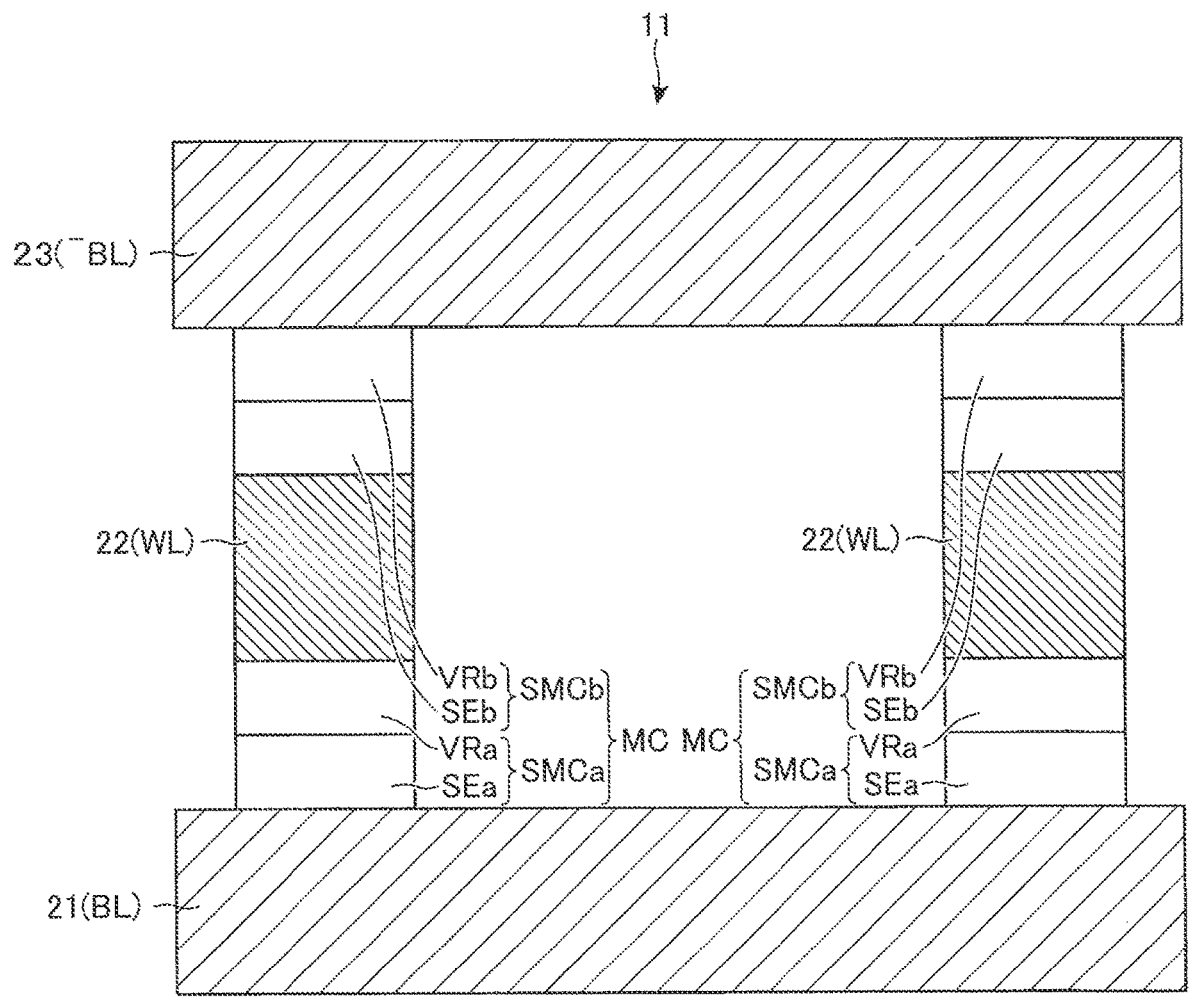
FIG. 5 shows a partial cross-sectional structure of the memory cell array of the first embodiment.

FIGS. 4 and 5 show partial cross-sectional configurations of the memory cell array 11 of the first embodiment. FIG. 4 shows a cross section taken along an xz plane, and FIG. 5 shows a cross section taken along a yz plane.

As shown in FIGS. 4 and 5, a plurality of conductors 21 are provided above a semiconductor substrate (not shown). The conductors 21 extend along the y-axis and are arranged along the x-axis. Each conductor 21 functions as a single bit line BL. The plurality of conductors 21 are derived from the same conductor. That is, the plurality of conductors 21 are formed by partially removing a conductor 21 that expands in the xy plane. Hereinafter, even if not explicitly stated, components located in a certain layer (one region of continuous ranges located at a certain height) and independent of each other are formed by partially removing a single material or a plurality of stacked materials. Thus, such components have less variable properties than components that are formed separately and made of independent materials.

Each conductor 21 is coupled, on the upper face thereof, to the bottom faces of the first sub memory cells SMCa of a plurality of memory cells MC. Each first sub memory cell SMCa has, for example, a circular shape in the xy plane. The first sub memory cells SMCa are arranged along the y-axis on each conductor 21, and with this arrangement, the first sub memory cells SMCa are arranged in a matrix in the xy plane. Each first sub memory cell SMCa includes a structure that functions as a selector SEa and a structure that functions as a variable resistance element VRa. The structure that functions as the selector SEa and the structure that functions as the variable resistance element VRa each include one or more stacked components, as will be described below.

A plurality of conductors 22 are provided in a layer which is one layer above the layer where the first sub memory cells SMCa are located. The conductors 22 extend along the x-axis and are arranged along the y-axis. On the bottom face, each conductor 22 is in contact with the upper faces of a plurality of first sub memory cells SMCa arranged along the x-axis. Each conductor 22 functions as one word line WL.

Each conductor 22 is coupled, on the upper face thereof, to the bottom faces of a plurality of second sub memory cells SMCb. Each second sub memory cell SMCb has, for example, a circular shape in the xy plane. The second sub memory cells SMCb are arranged along the x-axis on each conductor 22, and with this arrangement, the second sub memory cells SMCb are arranged in a matrix in the xy plane. Each second sub memory cell SMCb includes a structure that functions as a selector SEb and a structure that functions as a variable resistance element VRb. The structure that functions as the selector SEb and the structure that functions as the variable resistance element VRb each include one or more stacked components, as will be described below. Each second sub memory cell SMCb and a single first sub memory cell SMCa immediately below this second sub memory cell SMCb jointly constitute at least part of one memory cell MC.

A conductor 23 is provided on the upper faces of a plurality of second sub memory cells SMCb arranged along the y-axis. Each conductor 23 functions as one bit line BL.

1.1.4.1. Configuration of Sub Memory Cell

Figure 6:
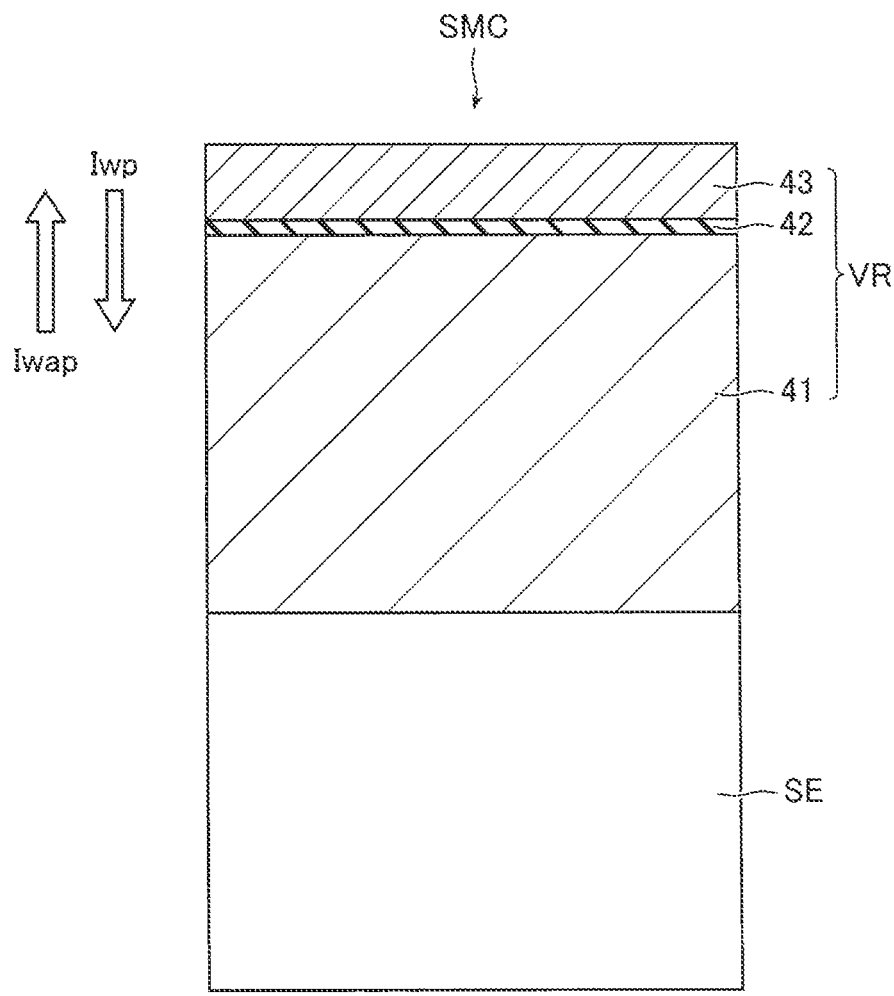
FIG. 6 shows a cross section of an example of a structure of a sub memory cell of the first embodiment.

FIG. 6 shows a cross section of an example of a structure of the sub memory cell SMC of the first embodiment. As shown in FIG. 6 and as described above, the sub memory cell SMC includes a selector SE and a variable resistance element VR.

The selector SE includes a variable resistance material. The selector SE may further include a lower electrode and an upper electrode. In this case, the variable resistance material is located on the upper face of the lower electrode, and the upper electrode is located on the upper face of the variable resistance material. The selector SE is, for example, a two-terminal switching element. The first terminal of the two terminals thereof corresponds to one of the upper face and the lower face of the selector SE, and the second terminal of the two terminals thereof corresponds to the other one of the upper face and the bottom face of the selector SE.

The variable resistance element VR is located on the upper face of the selector SE. The variable resistance element VR is, for example, a magnetic tunnel junction element (MTJ element). The description below and the drawings are based on an example in which the variable resistance element VR is an MTJ element. The MTJ element is an element used for an magnetoresistive random access memory (MRAM).

The variable resistance memory device 1 includes two sub memory cells SMC in each memory cell, and each sub memory cell includes an MTJ element. Such a cell method may be hereinafter referred to as a 2MTJ-per-cell method.

Specifically, the MTJ element VR includes a ferromagnetic layer 41, an insulating layer 42 and a ferromagnetic layer 43. By way of example, the insulating layer 42 is located on the upper face of the ferromagnetic layer 41, and the ferromagnetic layer 43 is located on the upper face of the insulating layer 42.

The ferromagnetic layer 41 has an easy magnetization axis extending along a direction penetrating the interfaces between the ferromagnetic layer 41, the insulating layer 42 and the ferromagnetic layer 43. The easy magnetization axis of the ferromagnetic layer 41 forms, for example, an angle of not less than 45° and not more than 90° with respect to the interfaces between the ferromagnetic layer 41, the insulating layer 42 and the ferromagnetic layer 43. For example, the easy magnetization axis of the ferromagnetic layer 41 is orthogonal to the interfaces. It is intended that the magnetization direction of the ferromagnetic layer 41 does not change even when data is read from the sub memory cell SMC and data is written to the sub memory cell SMC in the variable resistance memory device 1. The ferromagnetic layer 41 can function as a so-called reference layer. The ferromagnetic layer 41 contains, for example, one or more kinds of iron (Fe), cobalt (Co) and nickel (Ni). The ferromagnetic layer 41 may further contain boron (B). As a more specific example, the ferromagnetic layer 41 contains cobalt iron boron (CoFeB) or iron boride (FeB).

The ferromagnetic layer 41 may include a plurality of sub layers. The ferromagnetic layer 41 may have a synthetic antiferromagnetic (SAF) structure. In this case, the ferromagnetic layer 41 includes two ferromagnets (or, ferromagnetic layers) and a conductor (or, conductive layer) between the two ferromagnets. The conductor causes antiferromagnetical exchange-coupling between the two ferromagnets.

The insulating layer 42 contains or is made of, for example, magnesium oxide (MgO), and functions as a so-called tunnel barrier.

The ferromagnetic layer 43 contains a material exhibiting ferromagnetism and contains at least iron. Therefore, the ferromagnetic layer 43 has magnetization. The ferromagnetic layer 43 contains or is substantially formed of, for example, cobalt iron boron or iron boride. In the present specification and claims, the expression "substantially formed of" and a similar kind of expression using "substantially" are intended to mean that unintended impurities are allowed to be contained in components mentioned after "substantially formed of." Examples of the unintended impurities include atoms of the elements contained in the gas used in the manufacturing process of the variable resistance memory device 1, and atoms of the elements that have diffused into components "substantially formed of" something from around the components "substantially formed of" something.

The ferromagnetic layer 43 has an easy magnetization axis extending along a direction penetrating the interfaces between the ferromagnetic layer 41, the insulating layer 42, and the ferromagnetic layer 43. The easy magnetization axis of the ferromagnetic layer 43 forms, for example, an angle of not less than 45° and not more than 90° with respect to the interfaces between the ferromagnetic layer 41, the insulating layer 42 and the ferromagnetic layer 43. For example, the easy magnetization axis of the ferromagnetic layer 43 is orthogonal to the interfaces. The magnetization direction of the ferromagnetic layer 43 is switchable in accordance with data write to the sub memory cell SMC, and the ferromagnetic layer 43 can function as a so-called storage layer.

Where the magnetization direction of the ferromagnetic layer 43 is parallel to the magnetization direction of the ferromagnetic layer 41, the MTJ element VR has a low resistance. The state in which the magnetization direction of the ferromagnetic layer 43 is parallel to the magnetization direction of the ferromagnetic layer 41 will be hereinafter referred to as a P state or low resistance state of the sub memory cell SMC. On the other hand, where the magnetization direction of the ferromagnetic layer 43 is antiparallel to the magnetization direction of the ferromagnetic layer 41, the MTJ element VR has a higher resistance than the resistance exhibited where the magnetization direction of the ferromagnetic layer 41 is parallel to the magnetization direction of the ferromagnetic layer 43. The state in which the magnetization direction of the ferromagnetic layer 43 is antiparallel to the magnetization direction of the ferromagnetic layer 41 will be hereinafter referred to as an AP state or high resistance state of the sub memory cell SMC.

When a write current Iwp of a certain magnitude flows from the ferromagnetic layer 43 to the ferromagnetic layer 41, the magnetization direction of the ferromagnetic layer 43 becomes parallel to the magnetization direction of the ferromagnetic layer 41. On the other hand, when a write current Iwap of a certain magnitude flows from the ferromagnetic layer 41 to the ferromagnetic layer 43, the magnetization direction of the ferromagnetic layer 43 becomes antiparallel to the magnetization direction of the ferromagnetic layer 41.

The write currents Iwp and Iwap are named so because they are currents flowing through a write-target sub memory cell SMC during data write, and have dynamically variable magnitude during the operation of the variable resistance memory device 1.

The write current Iwp turns on the selector SE such that a current can flow from the face facing the ferromagnetic layer 41 toward the face opposite the ferromagnetic layer 41. The write current Iwap turns on the selector SE such that a current can flow from the face opposite the ferromagnetic layer 41 to the face facing the ferromagnetic layer 41.

The operation of causing a write current Iwp to flow through each sub memory cell SMC to make the magnetization direction of the ferromagnetic layer 43 of the sub memory cell SMC parallel to the magnetization direction of the ferromagnetic layer 41 may be referred to as P write. The write current Iwp may be hereinafter referred to as a P write current.

On the other hand, the operation of causing a write current Iwap to flow through each sub memory cell SMC to make the magnetization direction of the ferromagnetic layer 43 of the sub memory cell SMC antiparallel to the magnetization direction of the ferromagnetic layer 41 may be referred to as AP write. The write current Iwap may be hereinafter referred to as an AP write current.

1.1.5. Write Circuit

Figure 7:
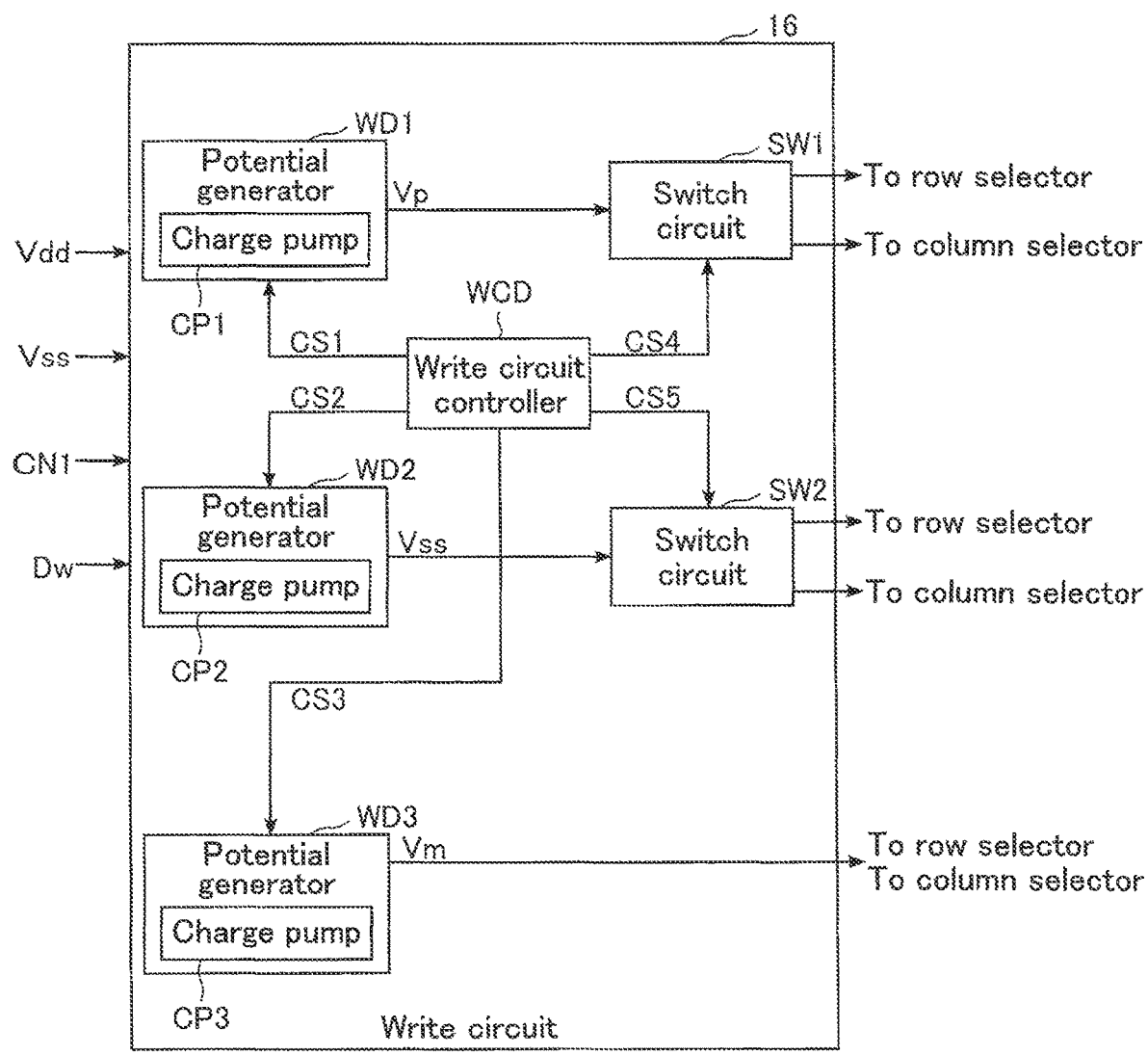
FIG. 7 shows functional blocks of a write circuit of the first embodiment.

FIG. 7 shows functional blocks of a write circuit 16 of the first embodiment. As shown in FIG. 7, the write circuit 16 includes potential generators (or, potential generator circuit) WD1, WD2, and WD3, a write circuit controller (or, write circuit controller circuit) WCD and switch circuits SW1 and SW2.

The write circuit controller WCD receives a control signal CN1 from the control circuit 13 (not shown) and also receives write data Dw. The write circuit controller WCD outputs signals CS1, CS2, CS3, CS4 and CS5 for operating the potential generators WD1, WD2 and WD3 and the switch circuits SW1 and SW2 such that the data write designated by the control signal CN1 and the write data Dw is performed.

The potential generator WD1 generates a write potential Vp by using the ground potential Vss and the power supply potential Vdd. The write potential Vp is named so because it is a potential applied to a certain word line WL during data write, and have dynamically variable magnitude during the operation of the variable resistance memory device 1. The write potential Vp has the same magnitude as the power supply potential Vdd, for example. The potential generator WD1 includes, for example, a charge pump CP1 and uses the ground potential Vss, the power supply potential Vdd and the charge pump CP1 to generate the write potential Vp. The potential generator WD1 receives the signal CS1 from the write circuit controller WCD. The potential generator WD1 generates a write potential Vp of a certain magnitude, based on the signal CS1, and outputs the generated write potential Vp. The potential generator WD1 can include, for example, a current driver circuit, or can be the current driver circuit itself.

The potential generator WD2 receives the ground potential Vss and receives the signal CS2 from the write circuit controller WCD. The potential generator WD2 outputs the ground potential Vss, based on the signal CS2. The potential generator WD2 can be, for example, a current sink circuit.

The potential generator WD3 generates an intermediate potential Vm by using the ground potential Vss and the power supply potential Vdd. The intermediate potential Vm has a magnitude between the power supply potential Vdd and the ground potential Vss. The intermediate potential Vm has, for example, a magnitude half of that of the power supply potential Vdd. The potential generator WD3 includes, for example, a charge pump CP3 and uses the ground potential Vss, the power supply potential Vdd and the charge pump CP3 to generate the intermediate potential Vm. The potential generator WD3 receives the signal CS3 from the write circuit controller WCD. The potential generator WD3 generates the intermediate potential Vm, based on the signal CS3, and outputs the generated intermediate potential Vm. The intermediate potential Vm is supplied to the row selector 14 and the column selector 15. The potential generator WD3 can include, for example, a current driver circuit, or can be the current driver circuit itself.

The switch circuit SW1 has a first end, a second end and a third end. The first end of the switch circuit SW1 is coupled to the output of the potential generator WD1. The second end is coupled to the row selector 14. The third end is coupled to the column selector 15. The switch circuit SW1 receives the signal CS4 from the write circuit controller WCD. The switch circuit SW1 couples the first end thereof to one of its second and third ends which is based on the signal CS4. The switch circuit SW1 includes, for example, a plurality of transistors.

The switch circuit SW2 has a first end, a second end and a third end. The first end of the switch circuit SW2 is coupled to the output of the potential generator WD2. The second end is coupled to the row selector 14. The third end is coupled to the column selector 15. The switch circuit SW2 receives the signal CS5 from the write circuit controller WCD. The switch circuit SW1 couples the first end thereof to one of its second and third ends which is based on the signal CS5. The switch circuit SW2 includes, for example, a plurality of transistors.

The write circuit controller WCD supplies the write potential Vp to the row selector 14, based on the write data Dw, and outputs the signals CS4 and CS5 to supply the ground potential Vss to the column selector 15. Further, the write circuit controller WCD supplies the ground potential Vss to the row selector 14, based on the write data Dw, and outputs the signals CS4 and CS5 so as to supply the write potential Vp to the column selector 15. Whether the write potential Vp is supplied to the row selector 14 or to the column selector 15 is dependent on the value of the write data Dw, that is, on the value of the data to be written to the memory cell MC.

1.1.6. Read Circuit

Figure 8:
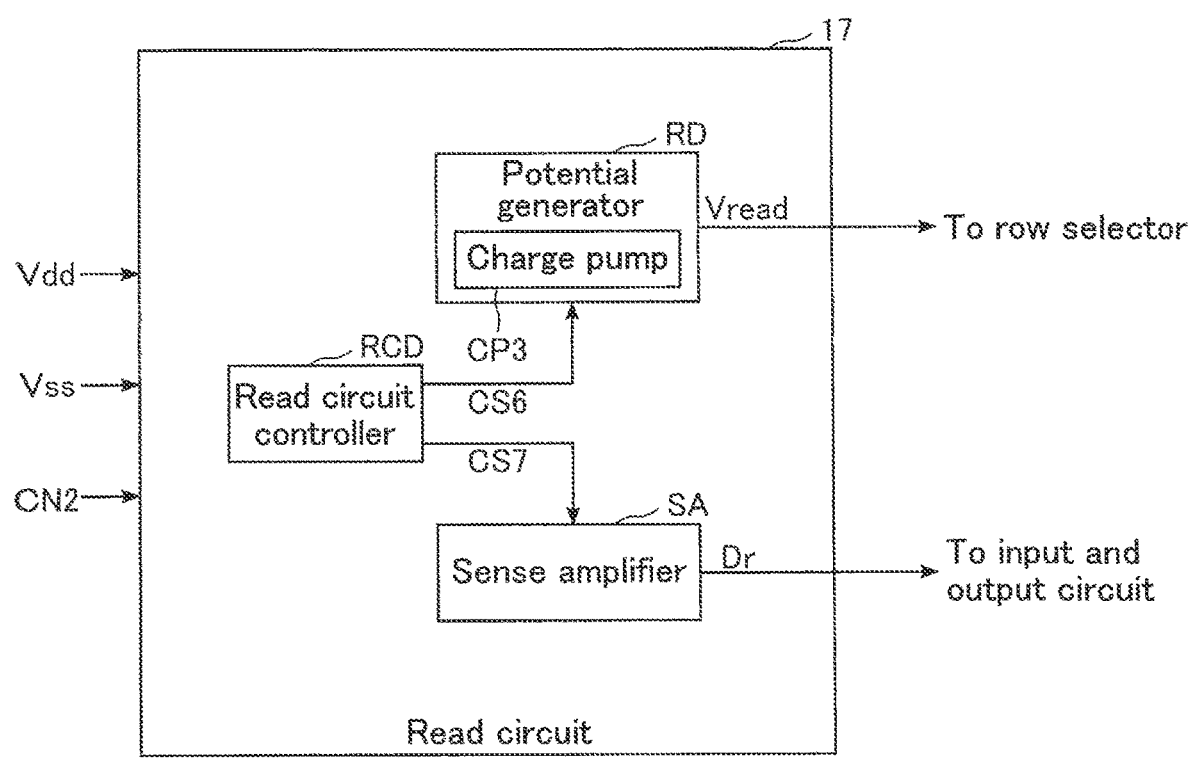
FIG. 8 shows functional blocks of a read circuit of the first embodiment.

FIG. 8 shows functional blocks of a read circuit 17 of the first embodiment. As shown in FIG. 8, the read circuit 17 includes a potential generator (or, potential generator circuit) RD, a sense amplifier SA and a read circuit controller (or, read circuit controller circuit) RCD.

The read circuit controller RCD receives the control signal CN2 from the control circuit 13 (not shown). The read circuit controller RCD outputs the signals CS6 and CS7 for operating the potential generator RD and the sense amplifier SA so that data can be read.

The potential generator RD generates a read potential Vread by using the ground potential Vss and the power supply potential Vdd. The potential generator RD includes, for example, a charge pump CP3 and uses the ground potential Vss, the power supply potential Vdd and the charge pump CP3 to generate the read potential Vread. The potential generator RD receives the signal CS6 from the read circuit controller RCD. The potential generator RD outputs the read potential Vread, based on the signal CS6. The potential generator RD can include, for example, a current driver circuit, or can be the current driver circuit itself. The read potential Vread is supplied to the row selector 14.

The sense amplifier SA receives the signal CS7 from the read circuit controller RCD. The sense amplifier SA operates based on the signal CS7. During data read, the sense amplifier SA is coupled, by the column selector 15, to one of the plurality of bit line pairs BLP that is associated with the column identified by an address signal ADD. The sense amplifier SA is a so-called differential amplification type amplifier circuit, and the description given below is based on this example. The differential amplification type sense amplifier amplifies the potential of one of the two interconnects to one of the magnitudes of two different levels, and amplifies the potential of the other interconnect to the other magnitude of the two different levels. The sense amplifier SA receives a potential Vb1 on the bit line BL of the coupled bit line pair BLP and also receives a potential Vb2 on the bit line ⎯BL of the coupled bit line pair BLP. The sense amplifier SA determines data stored in the memory cell MC coupled to the coupled bit line pair BLP, based on the potential Vb1 and the potential Vb2.

1.1.6.1. Sense Amplifier

FIG. 9 shows components of part of the read circuit 17 of the first embodiment and components of part of the column selector 15, and also shows how the components are coupled.

The column selector 15 couples one of the plurality of bit line pairs BLP that is associated with the column specified by an address signal ADD to the sense amplifier SA. FIG. 9 shows only one bit line pair BLP, that is, a bit line BL and a bit line ⎯BL.

The column selector 15 includes p-type metal oxide semiconductor field effect transistors (MOSFETs) TP1 and TP2 and n-type MOSFETs TN1 and TN2. The transistors TP1 and TN1 are coupled in parallel between the bit line BL and the global bit line GBL. The transistor TN1 receives a signal CL at its gate. The signal CL identifies the bit line pair BLP shown in FIG. 9, based on the address signal ADD. The signal CL is supplied, for example, from the control circuit 13. The transistor TP1 receives a signal ⎯CL at its gate. The symbol "⎯" at the beginning of the signal name indicates that the signal has a logic opposite to that of the signal whose name is not accompanied by the symbol "⎯".

The transistors TP2 and TN2 are coupled in parallel between the bit line ⎯BL and the global bit line ⎯GBL. The transistor TN2 receives a signal CL at its gate. The transistor TP2 receives a signal ⎯CL at its gate.

The sense amplifier SA includes n-type MOSFETs TN3, TN4, TN5, TN6, TN7, TN8 and TN9 and p-type MOSFETs TP3, TP4, TP5 and TP6.

The transistors TN3 and TN4 are coupled in series in this order between the global bit line GBL and a node of the ground potential Vss (the node may be hereinafter referred to as a ground node). The transistor TN3 receives a sense amplifier enable signal SAE at its gate. The sense amplifier enable signal SAE controls the enable/disable state of the sense amplifier SA, and is included, for example, in the signal CS7 supplied from the read circuit controller RCD. The transistor TN4 receives a signal PDE at its gate. The signal PDE is included, for example, in the signal CS7 supplied from the read circuit controller RCD. The node to which the transistor TN3 and the transistor TN4 are coupled will be referred to as a node NBL1.

The transistors TN5 and TN6 are coupled in series in this order between the global bit line ⎯GBL and the ground node. The transistor TN5 receives the sense amplifier enable signal SAE at its gate. The transistor TN6 receives the signal PDE at its gate. The node to which the transistor TN5 and the transistor TN6 are coupled will be referred to as a node NBL2.

The transistor NT7 is coupled between the node NBL1 and the node NBL2. The transistor TN7 receives the signal PDE at its gate.

The transistors TP3, TP4 and TN8 are coupled in series in this order between a power supply potential node (the node may be hereinafter referred to as a power supply node) and the ground node. The transistor TP3 receives a sense amplifier enable signal ⎯SAE at its gate. The sense amplifier enable signal ⎯SAE is included, for example, in the signal CS7 supplied from the read circuit controller RCD. The transistor TP4 and the transistor TN8 form a first inverter. The node to which the transistor TP4 and the transistor TN8 are coupled functions as an output of the first inverter and is coupled to the node NBL1. The gate of the transistor TP4 and the gate of the transistor TN8 are coupled to each other and function as an input of the first inverter.

The transistors TP5, TP6 and TN9 are coupled in series in this order between the power supply node and the ground node. The transistor TP5 receives the sense amplifier enable signal ⎯SAE at its gate. The transistor TP6 and the transistor TN9 form a second inverter. The node to which the transistor TP6 and the transistor TN9 are coupled functions as an output of the second inverter and is coupled to the node NBL2. The gate of the transistor TP6 and the gate of the transistor TN9 are coupled to each other and function as an input of the second inverter.

The first inverter, that is, the pair of transistors TP4 and TN8, and the second inverter, that is, the pair of transistors TP6 and TN9 are so-called cross-coupled. That is, the input of the first inverter, namely, the gates of the transistors TP4 and TN8 are coupled to the node NBL2, and the gates of the transistors TP6 and TN9 are coupled to the node NBL1. The node NBL2 functions as an output of the sense amplifier SA.

1.1.7. Row Selector

Figure 10:
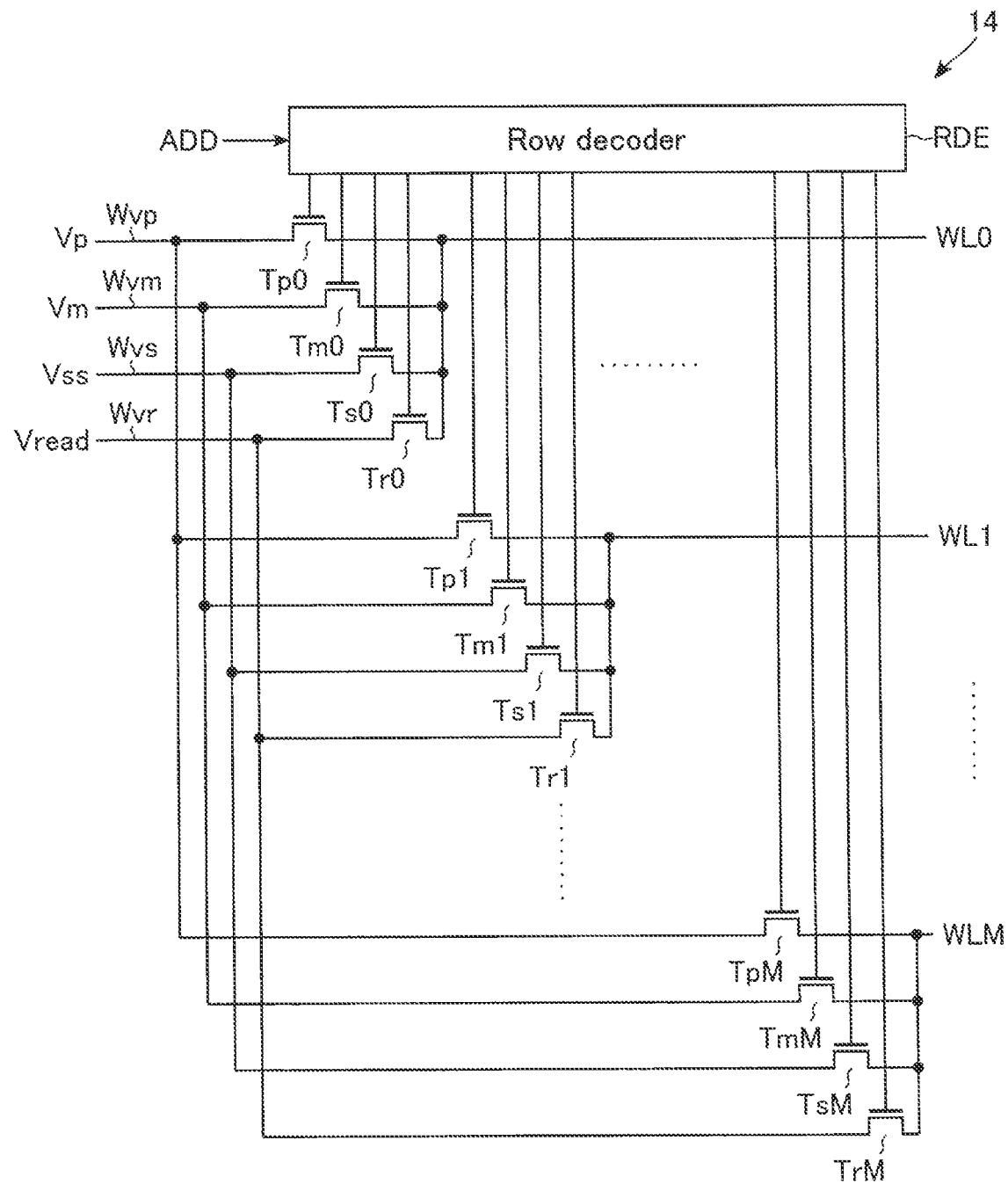
FIG. 10 shows components of a row selector of the first embodiment and also shows how the components are coupled.

FIG. 10 shows components of the row selector 14 of the first embodiment and also shows how the components are coupled. The row selector 14 is configured such that it can transfer dynamically selected one of a plurality of potentials received by the row selector 14 to one or more dynamically selected word lines WL of the word lines WL.

As shown in FIG. 10, the row selector 14 includes switches Tp (Tp0, Tp1, . . . TpM), Tm (Tm0, Tm1, . . . TmM), Ts (Ts0, Ts1, . . . TsM) and Tr (Tr0, Tr1, . . . TrM) that are provided for each word line WL. The switches Tp, Tm, Ts and Tr are, for example, n-type MOSFETs. The description below is based on this example. Each transistor Tp is coupled between a single word line WL and an interconnect Wvp. The interconnect Wvp is applied with the write potential Vp. Each transistor Tm is coupled between a single word line WL and an interconnect Wvm. The interconnect Wvm is applied with the intermediate potential Vm. Each transistor Ts is coupled between a single word line WL and an interconnect Wvs. The interconnect Wvs is applied with the ground potential Vss (i.e., the interconnect Wvs is grounded). Each transistor Tr is coupled between a single word line WL and an interconnect Wvr. The interconnect Wvr is applied with the read potential Vread.

The row selector 14 includes a row decoder RDE. The row decoder RDE receives the address signal ADD. The row decoder RDE controls the on/off states of the transistors Tp, Tm, Ts and Tr, based on the address signal ADD.

A more specific example of the row selector 14 is as follows. For example, the row selector 14 includes transistors Tp$\alpha$, Tm$\alpha$, Ts$\alpha$, and Tr$\alpha$ for all cases where $\alpha$ is an integer not less than 0 and not more than M. In all cases where $\alpha$ is an integer not less than 0 and not more than M, the transistor Tp$\alpha$ is coupled between the interconnect Wvp and the word line WL$\alpha$. In all cases where $\alpha$ is an integer not less than 0 and not more than M, the transistor Tm$\alpha$ is coupled between the interconnect Wvm and the word line WL$\alpha$. In all cases where $\alpha$ is an integer not less than 0 and not more than M, the transistor Ts$\alpha$ is coupled between the interconnect Wvs and the word line WL$\alpha$. In all cases where a is an integer not less than 0 and not more than M, the transistor Tr$\alpha$ is coupled between the interconnect WVr and the word line WL$\alpha$. Each of the transistors Tp, Tm, Ts, and Tr is coupled to the row decoder RDE at its gate.

1.1.8. Column Selector

Figure 11:
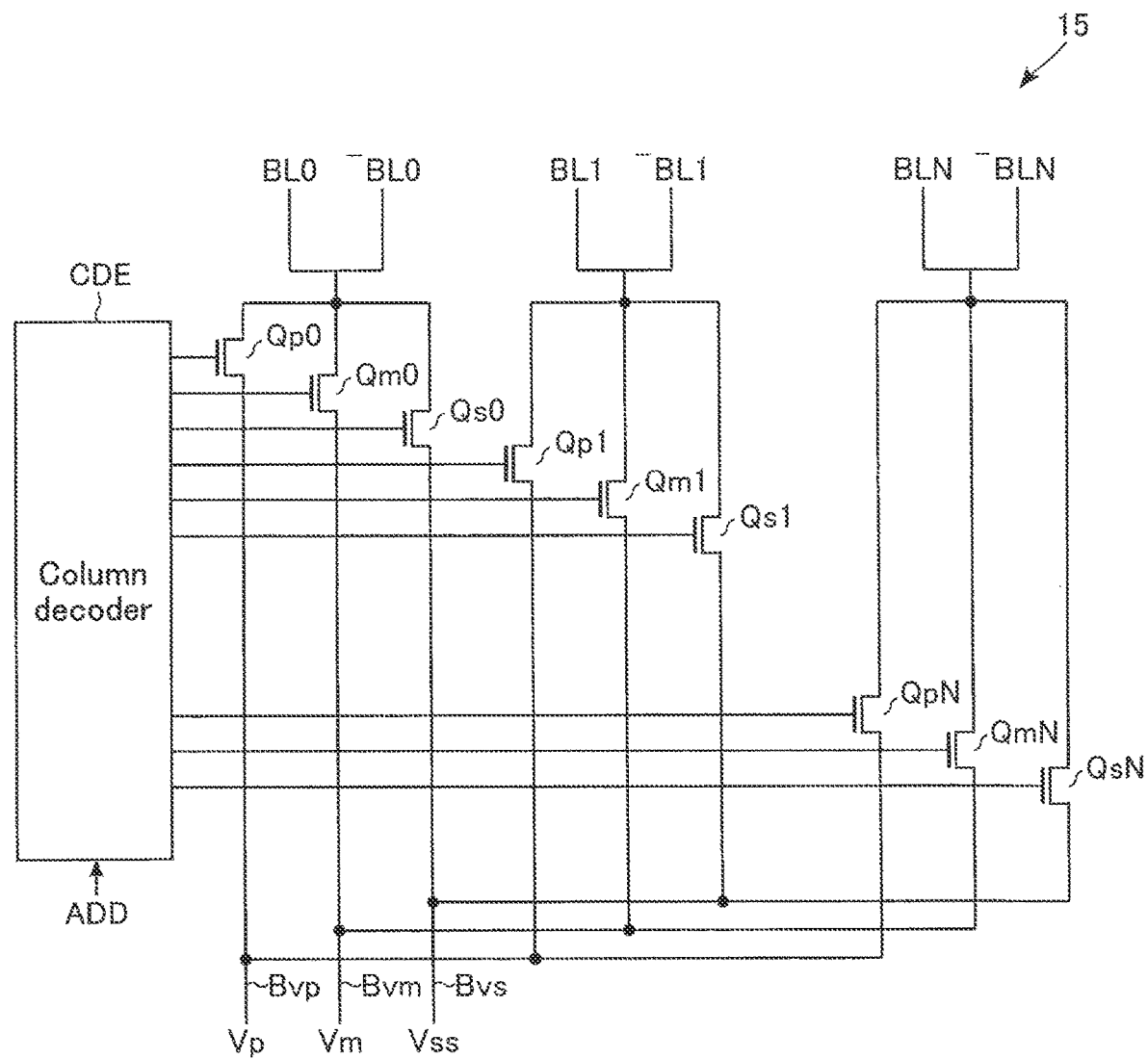
FIG. 11 shows components of a column selector of the first embodiment and also shows how the components are coupled.

FIG. 11 shows components of a column selector 15 of the first embodiment and also shows how the components are coupled. The column selector 15 is configured such that it can transfer dynamically selected one of a plurality of potentials received by the column selector 15 to one or more dynamically selected bit line pairs BLP of the bit line pairs BLP. In each bit line pair BLP, its bit lines BL and ‾BL are coupled to each other.

As shown in FIG. 11, the column selector 15 includes switches Qp (Qp0, Qp1, . . . QpN), Qm (Qm0, Qm1, . . . QmN) and Qs (Qs0, Qs1, . . . QsN) that are provided for each bit line pair BLP. The switches Qp, Qm and Qs are, for example, n-type MOSFETs. The description below is based on this example. Each transistor Qp is coupled between a single bit line pair BLP and an interconnect Bvp. The interconnect Bvp is applied with the write potential Vp. Each transistor Qm is coupled between a single bit line pair BLP and an interconnect Bvm. The interconnect Bvm is applied with the intermediate potential Vm. Each transistor Qs is coupled between a single bit line pair BLP and an interconnect Bvs. The interconnect Bvs is applied with the ground potential Vss (i.e., the wiring Bvs is grounded).

The column selector 15 also includes a column decoder CDE. The column decoder CDE receives the address signal ADD. The column decoder CDE controls the on/off states of the transistors Qp, Qm and Qs, based on the address signal ADD.

A more specific example of the column selector 15 is as follows. For example, the column selector 15 includes transistors Qp$\beta$, Qm$\beta$, and Qs$\beta$ for all cases where $\beta$ is an integer not less than 0 and not more than N. For all cases where $\beta$ is an integer not less than 0 and not more than N, the transistor Qp$\beta$ is coupled between the interconnect Bvp and the node to which the bit lines BL$\beta$ and ‾BL$\beta$ are coupled. In all cases where $\beta$ is an integer not less than 0 and not more than N, the transistor Qm$\beta$ is coupled between the interconnect Bvm and the node to which the bit lines BL$\beta$ and ‾BL$\beta$ are coupled. In all cases where $\beta$ is an integer not less than 0 and not more than N, the transistor Qs$\beta$ is coupled between the interconnect Bvs and the node to which the bit lines BL$\beta$ and ‾BL$\beta$ are coupled. Each of the transistors Qp, Qm and Qs is coupled to the column decoder CDE at its gate.

1.2. Operation
1.2.1. Data Write

Figure 12:
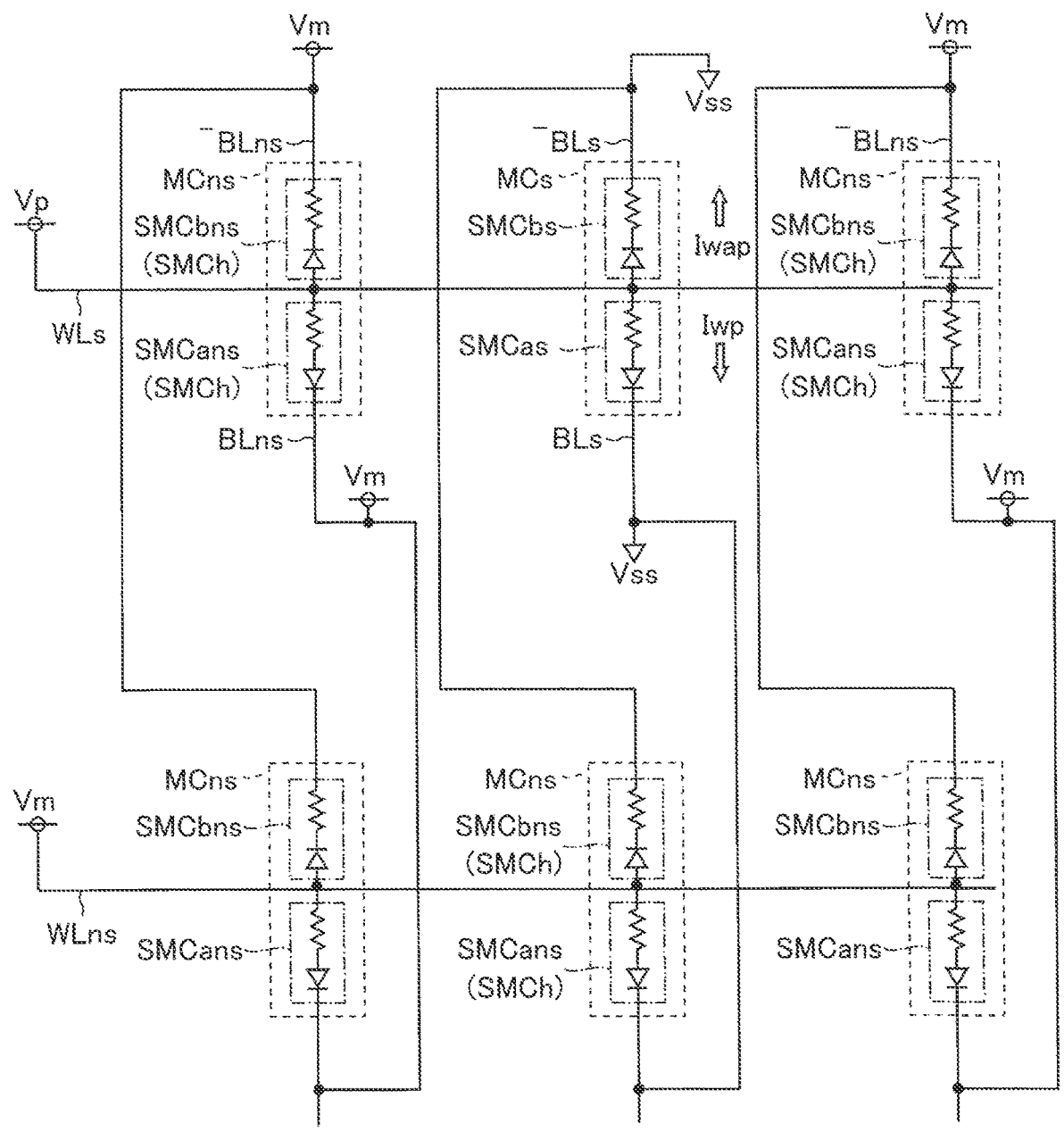
FIG. 12 shows how a state is during write of "1" data in part of the variable resistance memory device of the first embodiment.
Figure 13:
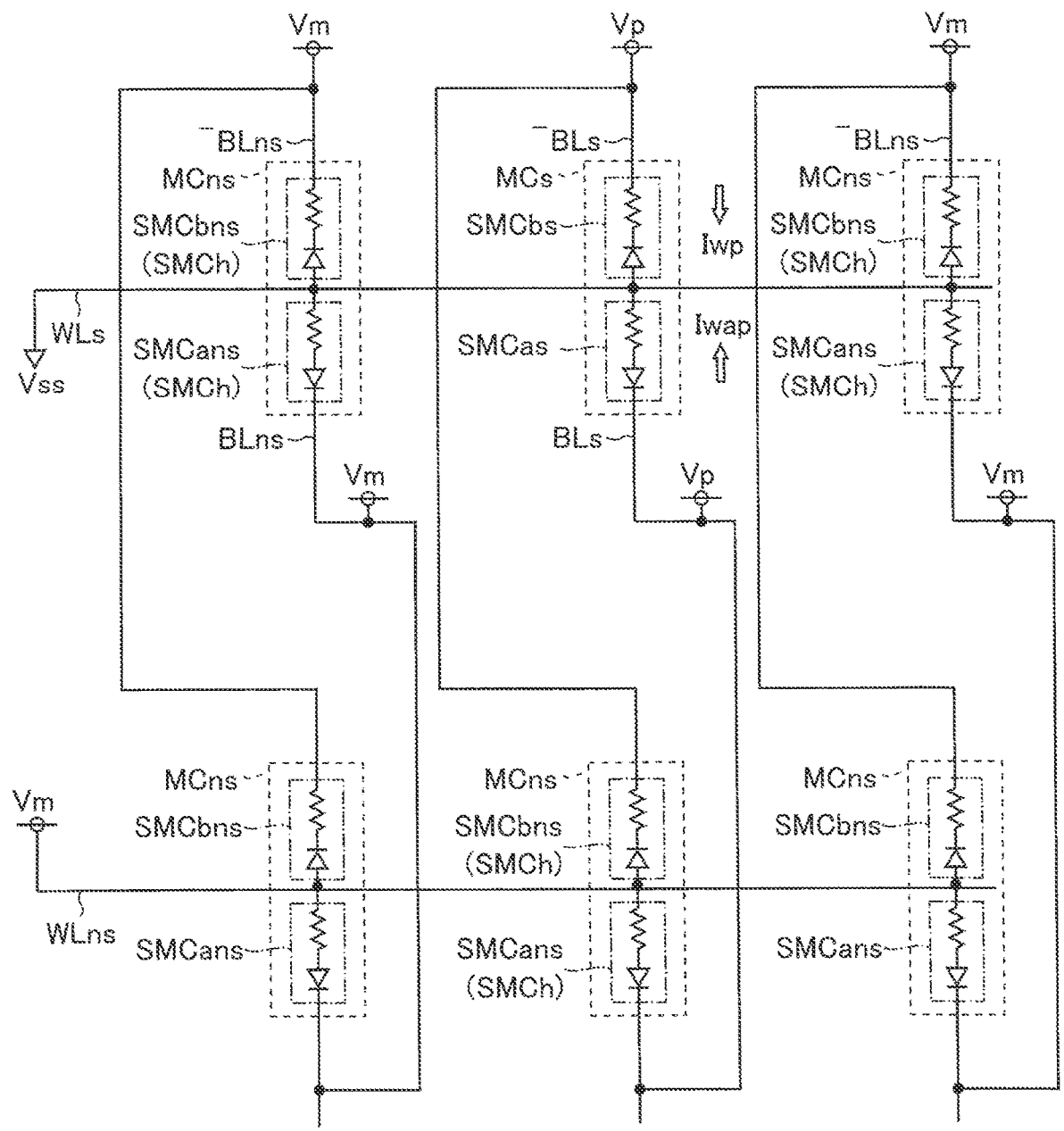
FIG. 13 shows how a state is during write of "0" data in part of the variable resistance memory device of the first embodiment.

FIGS. 12 and 13 show how a state is during data write in part of the variable resistance memory device 1 of the first embodiment. Specifically, FIGS. 12 and 13 show how the states of the components related to data write are during data write to a write-target memory cell MC. A write-target or read-target memory cell MC may be hereinafter referred to as a selected memory cell MCs. The sub memory cells SMC in the selected memory cell MCs may be referred to as selected sub memory cells SMCs. A first sub memory cell SMCa in the selected memory cell MCs may be referred to as a selected first sub memory cell SMCas. A second sub memory cell SMCb in the selected memory cell MCs may be referred to as a selected second sub memory cell SMCbs.

Of the memory cells MC, the memory cells MC other than the selected memory cells MCs may be referred to as non-selected memory cells MCns. A first sub memory cell SMCa in the non-selected memory cells MCns may be referred to as a non-selected first sub memory cell SMCans. A second sub memory cell SMCb in the non-selected memory cells MCns may be referred to as a non-selected second sub memory cell SMCbns.

Of the word lines WL, the word line WL designated by the address signal ADD may be referred to as a selected word line WLs. Of the word lines WL, the word lines WL other than the selected word line WLs may be referred to as non-selected word lines WLns.

Of the bit line pairs BLP, the bit line pair BLP specified by the address signal ADD may be referred to as a selected bit line pair BLPs. The bit line BL in the selected bit line pair BLPs may be referred to as a selected bit line BLs. The bit line ‾BL in the selected bit line pair BLPs may be referred to as a selected bit line ‾BLs.

Of the bit line pairs BLP, bit line pairs BLP other than the selected bit line pair BLPs may be referred to as non-selected bit line pairs BLPns. The bit lines BL in the non-selected bit line pairs BLPns may be referred to as non-selected bit lines BLns. The bit lines ‾BL in the non-selected bit line pairs BLPns may be referred to as non-selected bit lines ‾BLns.

FIGS. 12 and 13 not only show circuits but also illustrate structure of some of the components shown therein. Specifics of this will be described. The first sub memory cells SMCa are drawn below the word line WL in conformity with the structure shown in FIGS. 4 and 5. The second sub memory cells SMCb are drawn above the word line WL in conformity with the structures shown in FIGS. 4 and 5.

FIG. 12 shows how the state is when "1" data is written to the selected memory cells MCs. FIG. 13 shows how the state is when "0" data is written to the selected memory cells MCs. Data write to the selected memory cell MCs is performed by performing data write to the MTJ element VRa of the selected first sub memory cell SMCas and data write to the MTJ element VRb of the selected second sub memory cell SMCbs in parallel.

1.2.1.1. "1" Data Write

To write "1" data to the selected memory cell MCs, the write circuit 16, the row selector 14 and the column selector 15 form the state shown in FIG. 12, based on the control signal CN1, write data Dw and address signal ADD. Specifics of this will be described.

The write circuit 16 outputs the write potential Vp, the ground potential Vss and the intermediate potential Vm.

The column selector 15 couples interconnect Bvs to which the ground potential Vss is applied to selected bit lines BLs and ⎯BLs. The column selector 15 couples interconnect Bvm to which the intermediate potential Vm is applied to non-selected bit lines BLns and ⎯BLns.

The row selector 14 couples interconnect Wvp to which the write potential Vp is applied to a selected word line WLs. The row selector 14 couples interconnect Wvm to which the intermediate potential Vm is applied to a non-selected word line WLns.

With the word lines WL and the bit lines BL and ⎯BL being coupled as described above with reference to FIG. 12, the potentials shown in FIG. 12 are applied to the word lines WL and the bit lines BL and ⎯BL. That is, a voltage having a magnitude equal to the potential difference between the write potential Vp and the ground potential Vss is applied from the selected word line WLs to the selected bit line BLs. The voltage having a magnitude equal to the potential difference between the write potential Vp and the ground potential Vss is applied from the selected word line WLs to the selected bit line ⎯BLs. The voltage having a magnitude equal to the potential difference between the write potential Vp and the ground potential Vss may be hereinafter referred to as a write voltage Vwd. The magnitude of the write voltage Vwd is dependent on the magnitude of the write potential Vp. The write potential Vp has such a magnitude as enables the P write current Iwp or the AP write current Iwap to flow to a sub memory cell SMC to which the write voltage Vwd is applied, and as enables the selector SE of the sub memory cell SMC to be turned on. Therefore, by application of the write voltage Vwd, the P write current Iwp or the AP write current Iwap flows to the selected sub memory cell SMCs. By application of the write voltage Vwd from the selected word line WLs to the selected bit line BLs, the P write current Iwp flows through the selected first sub memory cell SMCas and P write is performed for the selected first sub memory cell SMCas. The selected first sub memory cell SMCas is in the P state after the P write. Further, by application of the write voltage Vwd from the selected word line WLs to the selected bit line ⎯BLs, the AP write current Iwap flows to the selected second sub memory cell SMCbs and AP write is performed for the selected second sub memory cell SMCbs. The selected second sub memory cell SMCbs is in the AP state after the AP write. After the P write performed for the selected first sub memory cell SMCas and the AP write performed for the selected second sub memory cell SMCbs, the selected memory cell MCs is in a state of storing "1" data. The operation for setting the state in which a memory cell MC stores "1" data may be hereinafter referred to as "1" data write to the memory cell MC.

On the other hand, an intermediate potential Vm is applied to the non-selected bit lines BLns and ⎯BLns. Therefore, a voltage is applied to the non-selected first sub memory cell SMCans between the selected word line WLs and the non-selected bit line BLns, and to the non-selected second sub memory cell SMCbns between the selected word line WLs and the non-selected bit line ⎯BLns. Hereinafter, the non-selected first sub memory cell SMCans between the selected word line WLs and the non-selected bit line BLns and the non-selected second sub memory cell SMCbns between the selected word line WLs and the non-selected bit line ⎯BLns may be referred to as being in the half-selected state, or may be referred to as half-selected sub memory cells SMCh. The voltage applied to the half-selected sub memory cells SMCh may be hereinafter referred to as a half-selection voltage.

There is no potential difference across the non-selected first sub memory cell SMCans, which is between the non-selected word line WLns and the non-selected bit line BLns, and the non-selected second sub memory cell SMCbns, which is between the non-selected word line WLns and the non-selected bit line ⎯BLns.

The half-selection voltage is applied also to the non-selected first sub memory cell SMCans between the non-selected word line WLns and the selected bit line BLs, and to the non-selected second sub memory cell SMCbns between the non-selected word line WLns and the selected bit line ⎯BLs.

The half-selection voltage has a magnitude equal to the difference between the write potential Vp and the intermediate potential Vm, or to the difference between the ground potential Vss and the intermediate potential Vm. The intermediate potential Vm is higher than the ground potential Vss and has, for example, a magnitude half that of the power supply potential Vdd, as described above. Therefore, the half-selection voltage is lower than the write voltage Vwd and allows only a current lower than both the P write current Iwp and the AP write current Iwap to flow. Therefore, neither the P write nor the AP write is performed for the half-selected sub memory cell SMCh, and data is selectively written in the selected memory cells MCs.

1.2.1.2. "0" Data Write

To write "0" data to the selected memory cell MCs, the write circuit 16, the row selector 14 and the column selector 15 form the state shown in FIG. 13, based on the control signal CN1, write data Dw and address signal ADD. Specifics of this will be described.

The write circuit 16 outputs a write potential Vp, a ground potential Vss and an intermediate potential Vm.

The column selector 15 couples interconnect Bvp to which the write potential Vp is applied to selected bit lines BLs and ⎯BLs. The column selector 15 couples interconnect Bvm to which the intermediate potential Vm is applied to non-selected bit lines BLns and ⎯BLns.

The row selector 14 couples interconnect Wvs to which the ground potential Vss is applied to a selected word line WLs. The row selector 14 couples interconnect Wvm to which the intermediate potential Vm is applied to non-selected word lines WLns.

With the word lines WL and the bit lines BL and ⎯BL being coupled as described above with reference to FIG. 13, the potentials shown in FIG. 13 are applied to the word lines WL and the bit lines BL and ⎯BL. That is, the write voltage Vwd is applied from the selected bit line BLs toward the selected word line WLs, and the write voltage Vwd is applied from the selected bit line ⎯BL toward the selected word line WLs. By application of the write voltage Vwd, the AP write current Iwap or the P write current Iwp flows to the selected sub memory cells SMCs. By application of the write voltage Vwd from the selected bit line BLs to the selected word line WLs, the AP write current Iwap flows through the selected first sub memory cell SMCas and AP write is performed for the selected first sub memory cell SMCas. The selected first sub memory cell SMCas is in the AP state after the AP write. Further, by application of the write voltage Vwd from the selected bit line ‾BLs to the selected word line WLs, the P write current Iwp flows through the selected second sub memory cell SMCbs and P write is performed for the selected second sub memory cell SMCbs. The selected second sub memory cell SMCbs is in the P state after the P write. After the AP write performed for the selected first sub memory cell SMCas and the P write performed for the selected second sub memory cell SMCbs, the selected memory cell MCs is in a state of storing "0" data. The operation for setting the state in which a memory cell MC stores "0" data may be hereinafter referred to as "0" data write to the memory cell MC.

For the same reason as described for the "1" data write, data is selectively written to the selected memory cells MCs also in the "0" data write.

1.2.2. Data Read

Figure 14:
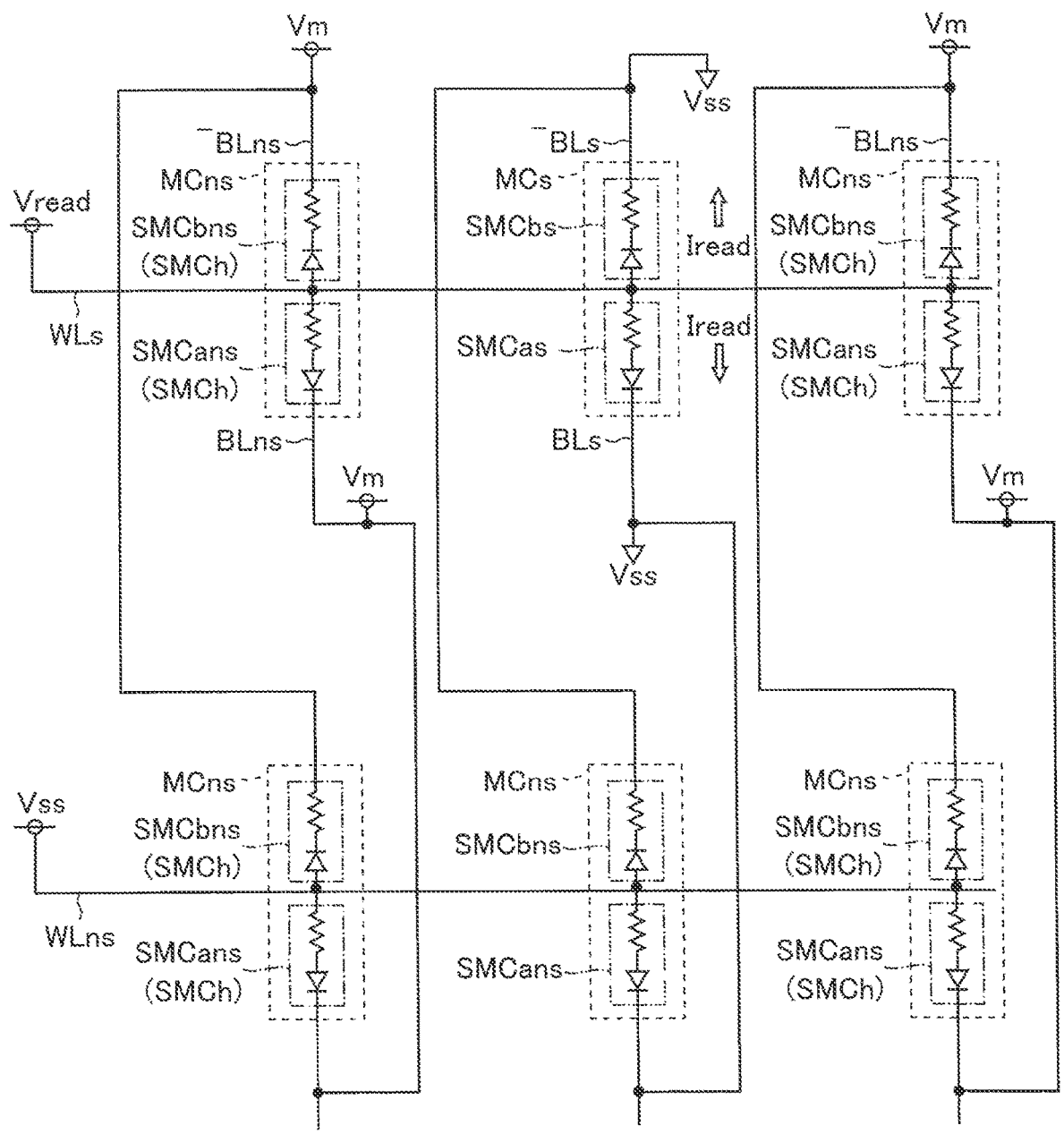
FIG. 14 shows how a state is during data read in part of the variable resistance memory device of the first embodiment.

FIG. 14 shows how a state is during data read in part of the variable resistance memory device 1 of the first embodiment. Specifically, FIG. 14 shows how the components related to data read are during data read from selected memory cells MCs. Like FIGS. 12 and 13, FIG. 14 illustrates not only the circuit but also the positions of the first sub memory cell SMCa and the second sub memory cell SMCb.

To read data from the selected memory cells MCs, the read circuit 17, the row selector 14 and the column selector 15 form the state shown in FIG. 14, based on the control signal CN2 and address signal ADD. Specifics of this will be described.

The read circuit 17 outputs the read potential Vread, ground potential Vss and intermediate potential Vm.

The column selector 15 keeps the signal CL at a high level. As a result, the selected bit lines BLs are coupled to the global bit line GBL in the sense amplifier SA (see FIG. 9), and the selected bit lines ‾BLs are coupled to the global bit line ‾GBL in the sense amplifier SA. The read circuit 17 temporarily asserts the signal PDE. During the assertion, the global bit line GBL and the global bit line ‾GBL are discharged. Next, column selector 15 couples interconnect Bvs to which the ground potential Vss is applied to selected bit line BLs and BLs. The column selector 15 couples interconnect Bvm to which the intermediate potential Vm is applied to non-selected bit lines BLns and ‾BLns.

Next, the row selector 14 couples interconnect Wvr to which the read potential Vread is applied to the selected word line WLs. The row selector 14 couples interconnect Wvs to which the ground potential Vss is applied to the non-selected word lines WLns.

In the state shown in FIG. 14, the read circuit 17 asserts the sense amplifier enable signal SAE. As a result, the sense operation by the sense amplifier SA starts. That is, the read current Iread flows through the selected first sub memory cell SMCas and the selected second sub memory cell SMCbs. The read current Iread causes the potential based on the resistance state (i.e., the P state or the AP state) of the selected first sub memory cell SMCas to be transferred to the global bit line GBL. Further, the read current Iread causes the potential based on the resistance state of the selected second sub memory cell SMCbs to be transferred to the global bit line ‾GBL. One of the selected first sub memory cell SMCas and the selected second sub memory cell SMCbs is in the P state, and the other is in the AP state. Therefore, the potential of the global bit line GBL and the potential of the global bit line ‾GBL are different from each other. This difference is amplified by the sense amplifier SA. As a result of the amplification, the power supply potential Vdd appears on one of the nodes NBL1 and NBL2, and the ground potential Vss appears on the other. Data stored in the selected memory cells MCs is determined by detecting whether the potential of the node NBL2 is higher than the potential of the node NBL1, for example, if it is the power supply potential Vdd, or by detecting whether the potential of the node NBL2 is lower than the potential of the node NBL1, for example, if it is the ground potential Vss. If the potential of the node NBL2 is lower than the potential of the node NBL1, this means that the selected first sub memory cell SMCas is in the P state and the selected second sub memory cell SMCbs is in the AP state. Therefore, it is determined that the selected memory cells MCs store "1" data. On the other hand, if the potential of the node NBL2 is higher than the potential of the node NBL1, this means that the selected first sub memory cell SMCas is in the AP state and the selected second sub memory cell SMCbs is in the P state. Therefore, it is determined that the selected memory cells MCs store "0" data.

The non-selected first sub memory cell SMCans between the non-selected word line WLns and the non-selected bit line BLns, and the non-selected second sub memory cell SMCbns between the non-selected word line WLns and the non-selected bit line ‾BLns are in the half-selected state. There is no potential difference across the non-selected first sub memory cell SMCans, which is between the non-selected word line WLns and the selected bit line BLs, and across the non-selected second sub memory cell SMCbns, which is between the non-selected word line WLns and the selected bit line ‾BLs. The non-selected first sub memory cell SMCans between the selected word line WLs and the non-selected bit line BLns, and the non-selected second sub memory cell SMCbns between the selected word line WLs and the non-selected bit line ‾BLns are set in the half-selected state. The half-selection voltage is applied to the half-selected sub memory cell SMCh. The half-selection voltage has a magnitude equal to the difference between the read potential Vread and the intermediate potential Vm. The intermediate potential Vm is higher than the ground potential Vss and has, for example, a magnitude half that of the power supply potential Vdd, as described above. Therefore, the half-selection voltage allows only a current smaller than the read current Iread to flow. Therefore, data is not read from the half-selected sub memory cell SMCh, and data is selectively read from the selected memory cells MCs.

1.3. Advantages

According to the first embodiment, it is possible to provide a variable resistance memory device that can operate at high speed and can be highly integrated, as will be described below.

The MTJ element stores data by utilizing a low resistance state and a high resistance state. Data read from the MTJ element is based on the determination of whether the MTJ element is in the low resistance state or in the high resistance state. To determine the resistance state of the MTJ element, use is made of a reference resistor having an average resistance of the resistance of the MTJ element in the low resistance state and the resistance of the MTJ element in the high resistance state. The resistance state of the MTJ element can be determined based on whether the current flowing through a read-target MTJ element is larger or smaller than a current flowing through the reference resistor (this current may be hereinafter referred to as a reference current). Where the MTJ element is in the low resistance state, the read current flowing through the MTJ element is a read current having a magnitude larger than the reference current (the read current will be referred to as a high read current), and where the MTJ element is in the high resistance state, the read current flowing through the MTJ element is a read current having a magnitude smaller than the reference current (the read current will be hereinafter referred to as a low read current).

The larger the difference between the reference current and the high read current is and/or the larger the difference between the reference current and the low read current is, the larger will be the read margin, and more accurate read is thus enabled. The difference between the reference current and the high read current and the difference between the reference current and the low read current are dependent on the ratio of the resistance of the MTJ element in the low resistance state to the resistance of the MTJ element in the high resistance state (i.e., an MR ratio). It is therefore desired that the MTJ element has a high MR ratio. In actuality, however the MR ratio is not as high as desired. To solve the disadvantage of the low MR ratio, so-called self-reference read is known. The self-reference read includes first read of data from a read-target MTJ element, write of data to the read-target MTJ element and second read of data from the read-target MTJ element. However, the self-reference read takes too long time to determine data.

To solve the disadvantage of the low MR ratio, a 2MTJ-per-cell method can be considered. Since the 2MTJ-per-cell method does not require a reference current for data read, there is no limitation on the read margin due to the low MR ratio. However, a variable resistance memory device that uses the 2MTJ-per-cell method has problems in that its storage capacity is only half that of a variable resistance memory device in which one memory cell includes one MTJ element (this method may be referred to as a 1MTJ-per-cell method). In order to increase the storage capacity of the variable resistance memory device of the 2MTJ-per-cell type, it is necessary to increase the number of MTJ elements. However, this requires an increase in the area of the memory cell array of the variable resistance memory device.

The variable resistance memory device 1 of the first embodiment uses the 2MTJ-per-cell method. Therefore, it is possible to read data independent of the MR ratio of the MTJ element VR. Further, in the variable resistance memory device 1 of the first embodiment, the bit lines BL, the word lines WL and the bit lines ⎯BL are arranged along the z-axis, each first sub memory cell SMCa is located between a single bit line BL and a single word line WL, and each second sub memory cell SMCb is located between a single word line WL and a single bit line ⎯BL. Therefore, two sub memory cells SMC constituting one memory cell MC are arranged along the z-axis direction. Therefore, the number of sub memory cells SMC that can be provided is twice as large as the number of sub memory cells SMC of a two-dimensional memory cell array 11. This makes it possible to provide a sub memory cell SMC for realizing the 2MTJ-per-cell method in the same area as the memory cells of the 1MTJ-per-cell method. Therefore, it is possible to realize a variable resistance memory device 1 of the 2MTJ-per-cell method that uses the same area as the memory cells MC arranged in the 1MTJ-per-cell method and yet has the same storage capacity as a variable resistance memory device of the 1MTJ-per-cell method.

1.4. Modification

Data read can be performed from two or more memory cells MC coupled to a selected word line WLs in parallel.

The variable resistance memory device 1 according to the modification includes two or more sense amplifiers SA in the read circuit 17. The number of sense amplifiers SA is equal to or greater than the number of memory cells MC from which data is read in parallel. A set of memory cells MC from which data is read in parallel constitute, for example, one column, and are specified by the column address included in an address signal ADD.

During the data read, the column selector 15 couples each of a plurality of selected bit line pairs BLPS coupled to the respective memory cells MC specified by the address signal ADD to a single sense amplifier SA. In this state, for each selected bit line pair BLPS, data read that was described for a single selected bit line pair BLPS with reference to FIG. 14 is performed in parallel.

2. Second Embodiment

The second embodiment is based on the first embodiment and relates to how data write is performed. In the description below, the differences from the first embodiment will be mainly described.

2.1. Configuration

Figure 15:
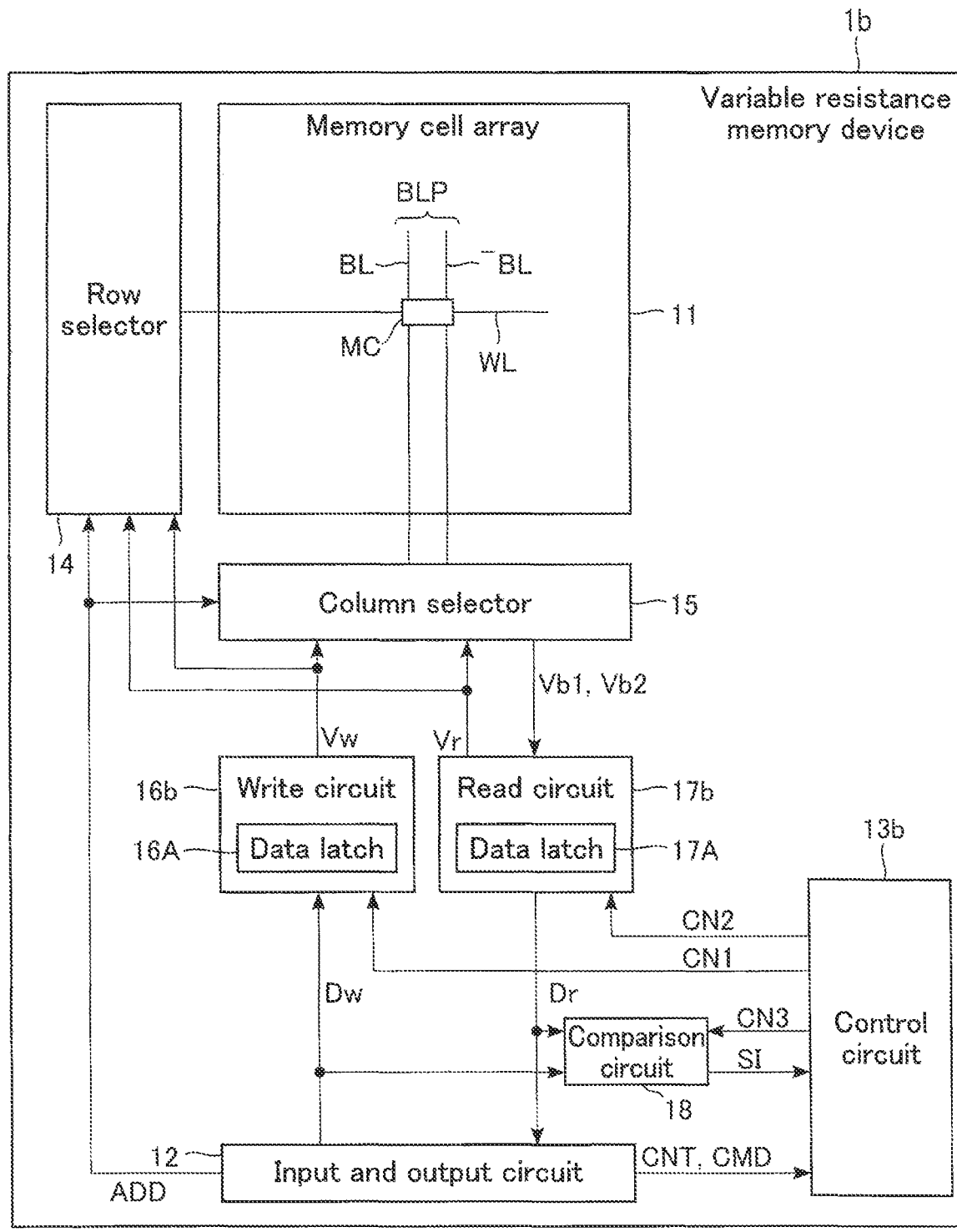
FIG. 15 shows functional blocks of a variable resistance memory device of a second embodiment.

FIG. 15 shows functional blocks of a variable resistance memory device of a second embodiment. In the description of FIG. 15, the components (or, functional blocks) that are not described are the same as the components of the first embodiment.

As shown in FIG. 15, the variable resistance memory device 1 of the second embodiment includes a comparison circuit 18, in addition to the components of the variable resistance memory device 1 of the first embodiment. The variable resistance memory device 1 of the second embodiment may be hereinafter referred to as a variable resistance memory device 1b in order to distinguish it from the variable resistance memory device 1 of the first embodiment. The control circuit 13, the write circuit 16 and the read circuit 17 of the second embodiment are partially different from the control circuit 13, the write circuit 16 and the read circuit 17 of the first embodiment. In the description below, the control circuit 13, the write circuit 16 and the read circuit 17 of the second embodiment may be referred to as a control circuit 13b, a write circuit 16b and a read circuit 17b, respectively, in order to distinguish them from the control circuit 13, the write circuit 16 and the read circuit 17 of the first embodiment.

The write circuit 16b includes a data latch 16A. When write data Dw is received by the write circuit 16b, the data latch 16A holds the received write data Dw. The write circuit 16b supplies the write data Dw held in the data latch 16A to the comparison circuit 18, based on the control signal CN1.

The read circuit 17b includes a data latch 17A. The data latch 17A holds read data Dr when the read data Dr is obtained. The read circuit 17b supplies the read data Dr to the comparison circuit 18, based on the control signal CN2.

The comparison circuit 18 receives the control signal CN3 from the control circuit 13b. The comparison circuit 18 compares the received write data Dw with the received read data Dr, based on the control signal CN3. The comparison circuit 18 supplies a signal SI to the control circuit 13b, based on the result of the comparison. The signal SI transmits information on the matching or mismatching between the write data Dw and the read data Dr.

The control circuit 13b, the write circuit 16b, the read circuit 17b and the comparison circuit 18 are so controlled as to perform the operations described below.

2.2. Operation

Figure 16:
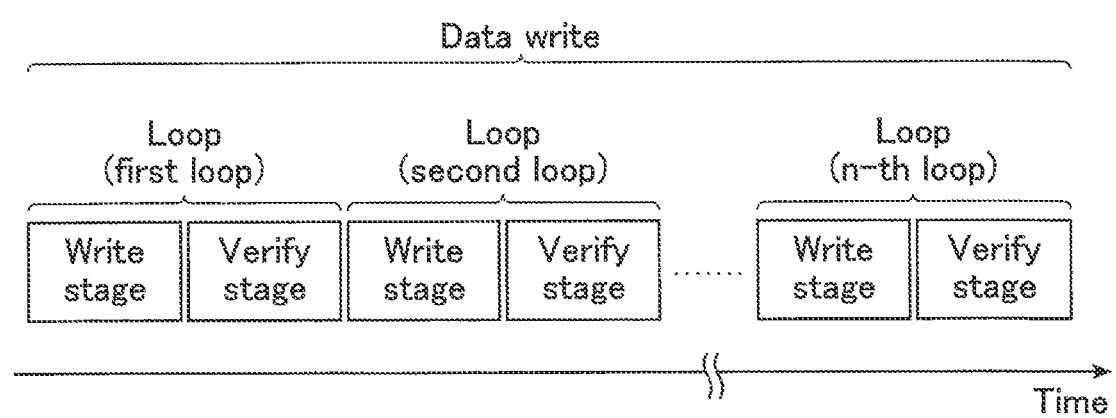
FIG. 16 shows how data write is performed in the variable resistance memory device of the second embodiment.

FIG. 16 shows how data write is performed in the variable resistance memory device of the second embodiment. Specifically, FIG. 16 shows an operation of data write to the selected memory cells MCs. As shown in FIG. 16, the data write includes one or more loops. FIG. 16 shows an example of the case where a plurality of loops are included. Each loop contains a write stage and a verify stage.

The write stage includes data write similar to the data write described in connection with the first embodiment. It should be noted that, as described later, a write potential Vp and a write voltage Vwd used for one loop may be differ from those used for another loop.

The verify stage includes data read similar to the data read described in connection with the first embodiment. The verify stage further includes a comparison between read data and write data. Where the read data and the write data are regarded as matching in the verify stage in a loop included in certain data write, the data write is ended. On the other hand, if the read data and the write data are not regarded as matching in the verify stage in the loop, the data write proceeds to the next loop.

FIGS. 17 and 18 show how the potentials of some interconnects are changed with time when data write is performed in the second embodiment. Specifically, FIG. 17 shows how the potentials of a word line WL and bit lines BL and ─BL are changed with time when "1" data is written to a selected memory cell MCs. FIG. 18 shows how the potentials of the word line WL and the bit lines BL and ─BL are changed with time when "0" data is written to a selected memory cells MCs. As part of the data write, write data Dw is held in the data latch 16A prior to the operation described below with reference to FIGS. 17 and 18.

2.2.1.1. "1" Data Write

As shown in FIG. 17, the ground potential Vss is applied to the selected bit lines BLs and ─BLs during data write. During the data write, the intermediate potential Vm is applied to non-selected word lines WLns, non-selected bit lines BLns and non-selected bit lines ─BLns.

The control circuit 13b performs the first loop of writing "1" data from time t1 to time t5. The write stage of the first loop is from time t1 to time t2. The verify stage of the first loop is from time t3 to time t5.

The control circuit 13b writes "1" data to the selected memory cell MCs from time t1 to time t2. That is, at time t1, the control circuit 13b controls the write circuit 16b to apply the write potential Vp to the selected word line WLs. The write potential Vp has a magnitude Vp1. The write potential Vp of the n-th loop (n is a natural number) may be hereinafter referred to as a write potential Vpn. The application of the write potential Vp1 continues until time t2. By application of the potential from time t1 to time t2, "1" data is written to the selected memory cell MCs. More specifically, the write voltage Vwd is applied from the selected word line WLs toward the selected bit line BLs, and the write voltage Vwd is applied from the selected word line WLs toward the selected bit line ─BLs. The write voltage Vwd of the n-th loop may be hereinafter referred to as a write voltage Vwdn. By application of the write voltage Vwd1, a P write current Iwp flows through the selected first sub memory cell SMCas, and an AP write current Iwap flows through the selected second sub memory cell SMCbs. The AP write current Iwap that is made to flow by the write voltage Vwd in the n-th loop may be hereinafter referred to as the AP write current Iwapn. The P write current Iwp that is made to flow by the write voltage Vwd in the n-th loop may be hereinafter referred to as the P write current Iwpn.

The control circuit 13b performs a verify operation in the first loop of the "1" data write from time t3 to time t4. As part of the verify operation, the control circuit 13b controls the read circuit 17b to read data from the selected memory cell MCs. For that purpose, the control circuit 13b controls the read circuit 17b to apply the read potential Vread to the selected word line WLs from time t3 to time t4. Read data Dr is obtained by the operation from time t3 to time t4.

The control circuit 13b compares the read data Dr with the write data Dw from time t4 to time t5. More specifically, from time t4 to time t5, the control circuit 13b performs the operation described below. The control circuit 13b uses the control signal CN1 to cause the write circuit 16b to supply the write data Dw to the comparison circuit 18. Further, the control circuit 13b uses the control signal CN2 to cause the read circuit 17b to supply the read data Dr to the comparison circuit 18. The control circuit 13b uses the control signal CN3 to cause the comparison circuit 18 to output the signal SI. The control signal CN3 contains, for example, information that enables the comparison circuit 18. Where the signal SI indicates matching between the read data Dr and the write data Dw, the control circuit 13b completes the "1" data write. Matching between the read data Dr and the write data Dw is referred to as a verify pass. On the other hand, where the signal SI indicates mismatching between the read data Dr and the write data Dw, the control circuit 13b proceeds to the second loop. The mismatching between the read data Dr and the write data Dw is referred to as a verify fail.

Hereinafter, the same operation as that performed in the first loop is repeated up to the verify pass. It should be noted that in the second and subsequent loops, the write potential Vpn used in the n-th loop is $\Delta$Vn higher than the write potential Vpm used in the m-th loop (m=n−1). $\Delta$Vn in one loop may be the same as or different from $\Delta$Vn in another loop.

In the description below, the outline of the operation performed after the second loop will be described mainly in terms of the potential applied to the selected word line WLs. The second loop is performed from time t6 to time t10. Specifically, from time t6 to time t7, the control circuit 13b controls the write circuit 16b to apply a write potential Vp2 to the selected word line WLs. The write potential Vp2 has a magnitude equal to the sum of the magnitude of the write potential Vp1 and $\Delta$V2. The write potential Vp2 is higher than the write potential Vp1. Therefore, the AP write current Iwap2 in the second loop is higher than the AP write current Iwap1 in the first loop, and the P write current Iwp2 in the second loop is higher than the P write current Iwp1 in the first loop.

For all cases where n is an integer not less than 3, the operations performed at time t(5n−4), time t(5n−3), time t(5n−2), time t(5n−1) and time t(5n) in the n-th loop are similar to the operations performed at time t1, time t2, time t3, time t4 and time t5, respectively, except that the write potential Vpn is used.

2.2.2. "0" Data Write

"0" data write is similar to "1" data write. In the description below, reference will be made to the points in which the "0" data write differs from the "1" data write. The difference lies in how a potential is applied in the write stage. That is, in each write stage, the ground potential Vss is applied to a selected word line WLs, and the write potential Vp is applied to selected bit lines BLs and ─BLs. A more specific description of this will be given.

As shown in FIG. 18, the control circuit 13b performs the first loop of "0" data write from time t31 to time t35. The write stage of the first loop is from time t31 to time t32. The verify stage of the first loop is from time t33 to time t35.

The control circuit 13b writes "0" data to the selected memory cell MCs from time t31 to time t32. That is, at time t31, the control circuit 13b controls the write circuit 16b to apply the write potential Vp1 to the selected bit lines BLs and ‾BLs. By application of the potential from time t31 to time t32, the write voltage Vwd1 is applied from the selected bit line BLs toward the selected word line WLs, and the write voltage Vwd1 is applied from the selected bit line ‾BLs toward the selected word line WLs. By application of the write voltage Vwd1, the AP write current Iwap1 flows through the selected first sub memory cell SMCas, and the P write current Iwp flows through the selected second sub memory cell SMCbs.

The operation from time t33 to time t34 is the same as the operation performed from time t3 to time t4 in the "1" data write.

The second and subsequent loops are similar to the first loop performed in the "0" data write. That is, for all cases where n is an integer not less than 2, the operations performed at time t(20n−4), time t(20n−3), time t(20n−2), time t(20n−1) and time t(20n) in the n-th loop are the same as the operations performed at time t31, time t32, time t33, time t34 and time t35, respectively, except that the write potential Vpn is used.

2.3. Advantages

The variable resistance memory device 1b of the second embodiment uses the 2MTJ-per-cell method, as in the first embodiment. Further, in the variable resistance memory device 1b, as in the first embodiment, the bit lines BL, the word lines WL and the bit lines ‾BL are arranged along the z-axis, each first sub memory cell SMCa is located between a single bit line BL and a single word line WL, and each second sub memory cell SMCb is located between a single word line WL and a single bit line ‾BL. Therefore, the same advantages as those of the first embodiment are attained.

Further, according to the second embodiment, it is possible to realize a variable resistance memory device in which write defects are suppressed, as described below.

To solve the disadvantage of the low MR ratio of the MTJ element, self-reference read is known. The self-reference read is applied to the 1MTJ-per-cell method. In the self-reference read, data read from a single memory cell (which may be hereinafter referred to as memory cell MCR) includes data read from a read-target memory cell MCR (which may be hereinafter referred to as a selected memory cell MCRs), data write to the selected memory cell MCRs and data read from the selected memory cell MCRs. Based on the comparison between the result of the first-time data read and the result of the second-time data read, data stored in the selected memory cell MCRs is determined.

The self-reference read can be applied to the configurations shown in FIGS. 4 and 5. In this case, the structure used as the sub memory cell SMC in the first embodiment is used as a single memory cell MCR. It is not necessary to distinguish between the bit line BL and the bit line ‾BL, as opposed to the first embodiment. Therefore, the conductor 23 used as the bit line ‾BL in the first embodiment also functions as the bit line BL. Each memory cell MCR is selected by a single word line coupled to the memory cell (selected word line WLs) and a single bit line coupled to the memory cell MCR (selected bit line BLs). As in the first embodiment, the data read performed by applying the read potential Vread to the selected word line WLs, and then comparing a first-time data read result and a second-time data read result both obtained by the sense amplifier coupled to the selected bit line BLs. During the data read, the intermediate potential Vm is applied to a non-selected word lines WLns and non-selected bit lines BLns, as in the first embodiment. The non-selected memory cell MCR between the selected word line WLs and a non-selected bit line BLns may be referred to as a half-selected memory cell MCRh. The variable resistance memory device in which the self-reference read is applied to the structure of FIGS. 4 and 5 may be referred to as a reference variable resistance memory device 100.

The variable resistance memory device having the structure of FIGS. 4 and 5 can cause a write disturb without reference to the read method. That is, the half-selection voltage is applied to a half-selected memory cell MCRh. The half-selection voltage can cause unintended data write, that is, erroneous write, to the half-selected memory cell MCRh with a certain probability.

The erroneous write can be suppressed by lowering the half-selection voltage. The half-selection voltage is dependent on the difference between the write potential Vp and the intermediate potential Vm, and on the difference between the intermediate potential Vm and the ground potential Vss. It is therefore possible to lower the half-selection voltage and suppress the erroneous write, by using a low write potential Vp and a low intermediate potential Vm. However, a decrease in the write potential Vp leads to a decrease in the write voltage Vwd. A decrease in the write voltage Vwd leads to a decrease in the AP write current Iwap and a decrease in the P write current Iwp, which in turn leads to an increase in write errors (write failures). Therefore, the adjustment of the write potential Vp and the intermediate potential Vm cannot realize both the suppression of the write disturb and the suppression of the write error.

Suppression of the write disturb and suppression of erroneous writing can be achieved by repeating a loop including a verify. That is, the write disturb is suppressed by using a low write potential Vp and a low intermediate potential Vm in the first loop. On the other hand, a write error may occur due to the limitation of the write voltage Vwd. However, by repeating a loop including a verify operation and increasing a write potential Vp after each loop, write can be performed at the lowest write voltage Vwd that can suppress the write disturb. As described above, however, the self-reference read includes reading data twice from a selected memory cell MCRs in determining data required for a verify operation. Therefore, it is necessary to read the data twice for each verify operation of the loop. Accordingly, the combined use of self-reference read and the verify operation makes data write excessively long.

The variable resistance memory device 1b of the second embodiment uses the 2MTJ-per-cell method. In the 2MTJ-per-cell method, as described in connection with the first embodiment, the data read from the selected memory cell MCs includes reading data from the two selected sub memory cells SMCs, but these reads are performed in parallel. Therefore, the variable resistance memory device 1b does not require reading data twice, as required for self-reference read from a selected memory cell MCRs, and does not require data write as required for the self-reference read. As a result, the variable resistance memory device 1b can read data in a short time. Therefore, the verify operation can be performed in a short time, and the repetition of the loop including the verify operation only requires a time that is shorter than the time required by the reference variable resistance memory device 100. Therefore, the variable resistance memory device 1b can realize suppression of write disturb, suppression of write errors and short-time data write.

3. Third Embodiment

The third embodiment differs from the first embodiment in terms of the structure of the memory cell array. In the description below, the differences from the first embodiment will be mainly described.

3.1. Configuration

The variable resistance memory device 1 of the third embodiment may be referred to as a variable resistance memory device 1c in order to distinguish it from the variable resistance memory devices 1 of the first and second embodiments. The variable resistance memory device 1c includes a memory cell array 11 different from the memory cell array 11 of the variable resistance memory device 1 of the first embodiment.

The memory cell array 11 of the third embodiment may be hereinafter referred to as a memory cell array 11c in order to distinguish it from the memory cell array 11 of the first embodiment.

Figure 20:
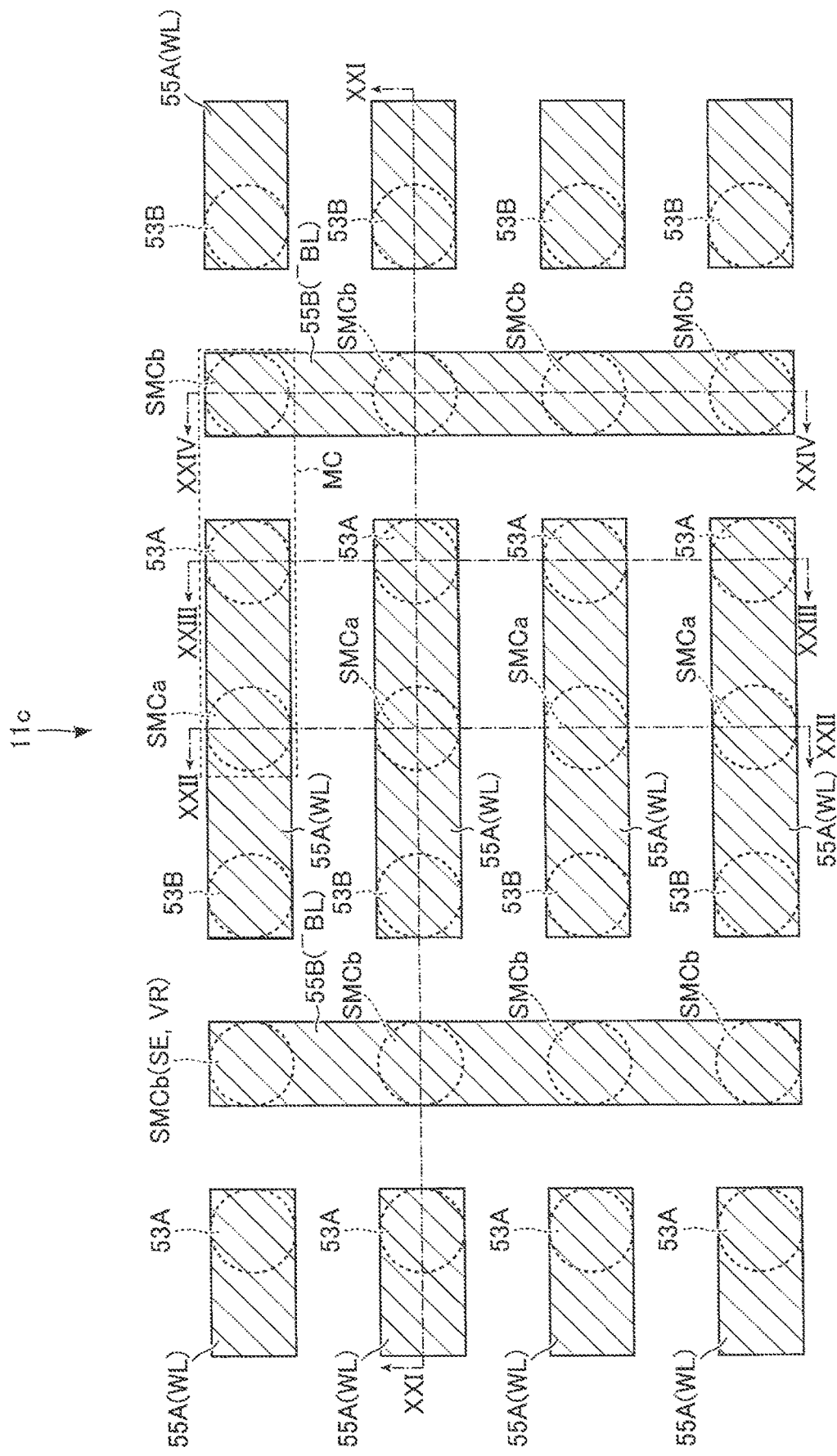
FIG. 20 shows a partial plan structure of the memory cell array of the third embodiment.

FIGS. 19 and 20 show a partial planar structure of the memory cell array 11c of the third embodiment. FIGS. 19 and 20 show structure along an xy plane and show the same region in the xy plane. FIG. 19 shows a plurality of layers arranged along the z-axis. FIG. 20 shows one of the layers shown in FIG. 19 and a layer above the layer shown in FIG. 19. FIGS. 19 and 20 include hatched components to facilitate visual distinction of the components. It should be noted that hatching is used only for distinguishing the components, and the materials of the components are not specified or limited to those indicated by the hatching patterns.

As shown in FIG. 19, a plurality of conductors 51 are provided in a certain layer. The conductors 51 include conductors 51A and conductors 51B. The conductors 51A extend along the x-axis and are spaced apart along the y-axis. Each conductor 51A functions as at least part of a single word line WL.

The conductors 51B extend along the y-axis. Each conductor 51B is located between a set of conductors 51A arranged along the y-axis and another set of conductors 51A arranged along the y-axis. Each conductor 51B is spaced from the conductors 51A on both sides thereof. Each conductor 51B functions as at least part of one bit line BL.

A plurality of contact plugs 53 and a plurality of sub memory cells SMC are provided in a layer which is one layer above the layer where the conductors 51 are provided. The contact plugs 53 have, for example, a circular shape in the xy plane. The contact plugs 53 include contact plugs 53A and 53B. A single contact plug 53A and a single contact plug 53B form a pair. Each pair of contact plugs 53A and 53B overlaps a single conductor 51A at least partially, and is located directly above the conductor 51A as viewed along the z-axis. The contact plug 53A overlaps the conductor 51A at the left end of the conductor 51A. The contact plug 53B overlaps the conductor 51A at the right end of the conductor 51A. A plurality of conductors 51A arranged along the y-axis and a plurality of contact plugs 53A overlapping them are arranged along the y-axis. The plurality of conductors 51A arranged along the y-axis and the plurality of contact plugs 53B overlapping them are arranged along the y-axis.

Each sub memory cell SMCb overlaps a single conductor 51A at least partially, and is located directly above the conductor 51A as viewed along the z-axis. Each sub memory cell SMCb is located between a single contact plug 53A and a single contact plug 53B. In other words, a single contact plug 53A, a single sub memory cell SMCb and a single contact plug 53B are arranged along the x-axis in the region which is above each conductor 51A as viewed along the z-axis. A plurality of conductors 51A arranged along the y-axis and a plurality of sub memory cells SMCb overlapping them are arranged along the y-axis.

Each sub memory cell SMCa overlaps a single conductor 51B at least partially, and is located directly above the conductor 51B as viewed along the z-axis. Some of the sub memory cells SMCa are spaced apart along the y-axis. Each sub memory cell SMCa is located between two conductors 51A arranged along the x-axis. Therefore, one contact plug 53B, one sub memory cell SMCa and one contact plug 53A are arranged along the x-axis.

An area including a single contact plug 53 and the areas on both sides thereof extending along the x-axis up to the two sub memory cells SMC constitute a single memory cell MC. FIG. 19 and subsequent figures and the description in the specification are based on an example in which each memory cell MC is configured such that a single sub memory cell SMCa, a single contact plug 53A and a single sub memory cell SMCb arranged along the x-axis are included in a single memory cell MC. However, each memory cell MC may be configured such that a single sub memory cell SMCb, a single contact plug 53B and a single sub memory cell SMCa arranged along the x-axis are included in one memory cell MC.

As shown in FIG. 20, a plurality of conductors 55 are provided in a layer which is one layer above the layer where the contact plug 53 and the plurality of sub memory cells SMC are provided. The conductors 55 include conductors 55A and conductors 55B. The conductors 55A extend along the x-axis and are spaced apart along the y-axis. Each conductor 55A partially overlaps a single contact plug 53B, a single sub memory cell SMCa and a single contact plug 53A that are arranged along the x-axis. For example, each conductor 55A is located directly above a single contact plug 53B, a single sub memory cell SMCa and a single contact plug 53A that are arranged along the x-axis, and is spaced therefrom along the z-axis. Each conductor 55A functions as at least part of a single word line WL.

Each conductor 55B extends along the y-axis. Each conductor 55B is located between a set of conductors 55A arranged along the y-axis and another set of conductors 55A arranged along the y-axis. Each conductor 55B is spaced from the conductors 55A on both sides thereof. Each conductor 55B partially overlaps a plurality of sub memory cells SMCb arranged along the y-axis, and is located directly above the plurality of sub memory cells SMCb arranged along the y-axis and is spaced therefrom along the z-axis. Each conductor 55B functions as at least part of a single bit line /BL.

Figure 22:
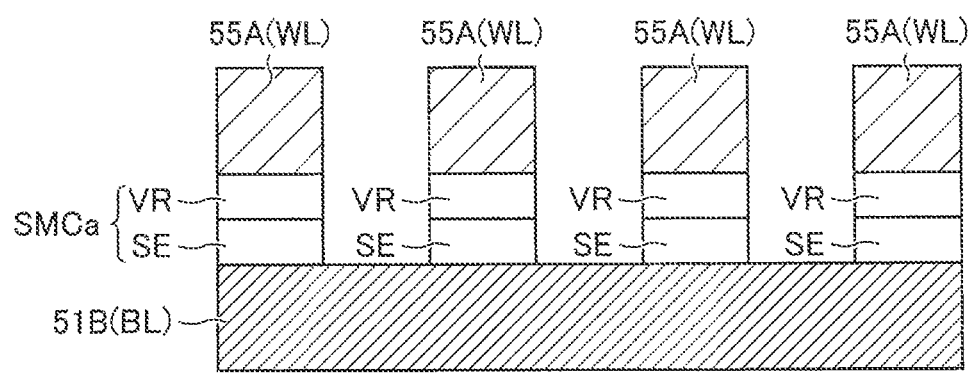
FIG. 22 shows a partial cross-sectional structure of the memory cell array of the third embodiment.
Figure 23:
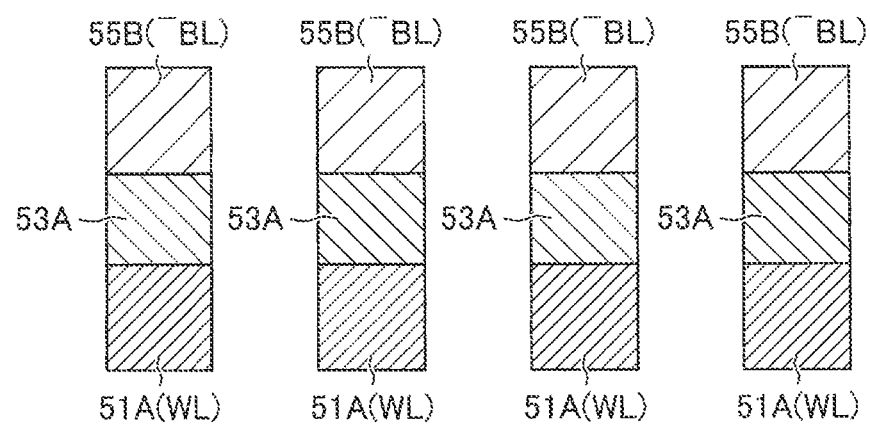
FIG. 23 shows a partial cross-sectional structure of the memory cell array of the third embodiment.
Figure 23:
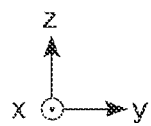
Figure 24:
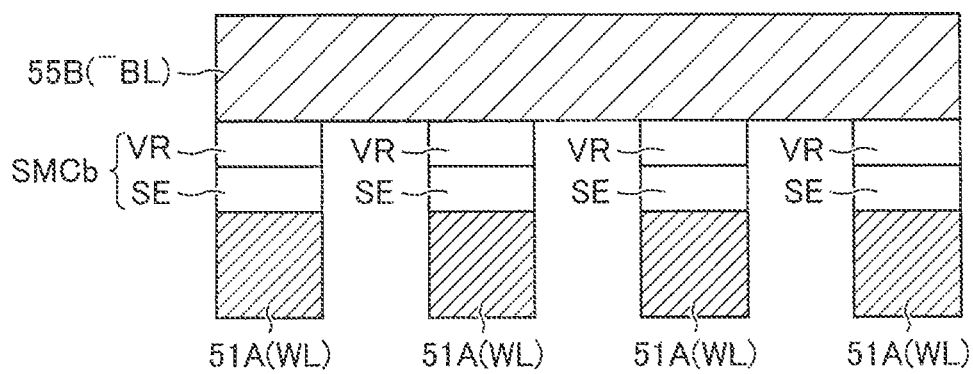
FIG. 24 shows a partial cross-sectional structure of a memory cell array of the fourth embodiment.

FIG. 21, FIG. 22, FIG. 23 and FIG. 24 show a partial cross sectional structure of the memory cell array 11c of the third embodiment. FIG. 21 shows a cross section taken along the line XXI-XXI of FIGS. 19 and 20. FIG. 22 shows a cross section taken along the line XXII-XXII of FIGS. 19 and 20. FIG. 23 shows a cross section along the line XXIII-XXIII of FIGS. 19 and 20. FIG. 24 shows a cross section taken along the line XXIV-XXIV of FIGS. 19 and 20.

The conductors 51A and 51B alternate along the x-axis in the bottom layer shown in FIG. 21, as shown in FIG. 21 and as described with reference to FIGS. 19 and 20. The conductors 51A and 51B are derived from the same conductor. That is, the conductors 51A and 51B are formed by partially removing a conductor that expands along an xy plane such that the conductors 51A and 51B remain.

The contact plugs 53A and 53B and the sub memory cells SMCa and SMCb are located one layer above the layer where the conductors 51A and 51B are provided. Each set consisting of a single contact plug 53A, a single sub memory cell SMCb and a single contact plug 53B is located on the upper face of a single conductor 51A. A single contact plug 53A, a single sub memory cell SMCb and a single contact plug 53B of each set are arranged at intervals along the x-axis. Each sub memory cell SMCa is located on the upper face of a single conductor 51B.

The sub memory cells SMCa and SMCb are derived from the same material. That is, the component located in a certain layer of the sub memory cell SMCa and the component located in the same layer of the sub memory cell SMCb are derived from the same material (e.g., a conductor, an insulator, a ferromagnetic material, etc.). A more specific description of this will be given. As described with reference to FIG. 6, the sub memory cell SMC includes a plurality of stacked components including a selector SE, a ferromagnetic layer 41, an insulating layer 42 and a ferromagnetic layer 43. The sub memory cells SMCa and SMCb of the third embodiment are formed in parallel by a series of steps in the manufacturing process of the variable resistance memory device 1c. For example, where the structure of FIG. 6 is based on, a material expanding in the xy plane for the selector SE is formed, and this material is partially removed such that selectors SEa and SEb are formed for the sub memory cells SMCa and SMCb. The same applies to the ferromagnetic layer 41, the insulating layer 42 and the ferromagnetic layer 43 as well. A plurality of materials expanding in the xy plane for the ferromagnetic layer 41, the insulating layer 42 and the ferromagnetic layer 43 are stacked, and the plurality of materials are partially removed to form an MTJ element VRa of the sub memory cell SMCa and an MTJ element VRb of the sub memory cell SMCb. The same applies to the case where the sub memory cells SMCa and SMCb have an additional component that is not shown in FIG. 6, and also to the case where one or more of the selector SE, the ferromagnetic layer 41 and the ferromagnetic layer 43 are composed of a plurality of components. Therefore, the characteristics of the sub memory cells SMCa and SMCb are prevented from varying due to variations in the process.

The conductors 55A and 55B are located in one layer above the layer where the contact plugs 53A and 53B and the sub memory cells SMCa and SMCb are provided. Each conductor 55A is in contact with the upper faces of a single contact plug 53B, a single sub memory cell SMCa and a single contact plug 53A. Each conductor 55B is located on the upper face of a single sub memory cell SMCb. The conductors 55A and 55B are derived from the same conductor. That is, the conductors 55A and 55B are formed by partially removing a conductor that expands in the xy plane such that the conductors 55A and 55B remain.

The sub memory cells SMCa are located on the upper face of each conductor 51B, as shown in FIG. 22 and described with reference to FIGS. 19 and 20. The bottom face of each conductor 55A is in contact with the upper face of each of sub memory cells SMCa arranged along the y-axis.

A single contact plug 53A is located on the upper face of each conductor 51A, as shown in FIG. 23 and described with reference to FIGS. 19 and 20. Each conductor 55B is located on the upper face of a single contact plug 53A.

A single sub memory cell SMCb is located on the upper face of each conductor 51A, as shown in FIG. 24 and as described with reference to FIGS. 19 and 20. The bottom face of each conductor 55B is in contact with the upper face of each of the sub memory cells SMCb arranged along the y-axis.

3.2. Advantages

With the structure of the memory cell array 11c of the third embodiment, it is possible to configure a circuit that is described with reference to FIG. 3 in connection with the first embodiment. Therefore, the 2MTJ-per-cell method can be realized by the third embodiment as well, and data can be read without depending on the MR ratio of the MTJ element VR, for the same reason as described in connection with the first embodiment.

Further, according to the third embodiment, it is possible to provide a variable resistance memory device 1c in which data write and/or data read with reference to a memory cell MC can be controlled easily, as described below.

Sub memory cells SMC are sensitive to heat. Therefore, where heat is applied to the sub memory cells SMC in the manufacturing process, the characteristics of the sub memory cells SMC may change. The sub memory cells SMCa and SMCb are derived from the same set of stacked components and are formed by the same series of manufacturing processes. Therefore, the sub memory cells SMCa and SMCb are subjected to the same heat treatment, and their characteristics are similarly changed as a result of the heat treatment. This suppresses variations in the characteristics of the sub memory cells SMCa and SMCb, and the sub memory cells SMCa and SMCb have substantially the same characteristics. Therefore, the P write current Iwp and the AP write current Iwap required for the sub memory cell SMCa are very close to, and substantially the same as the P write current Iwp and the AP write current Iwap required for the sub memory cell SMCb, respectively. This suppresses the difference between the condition required for writing "0" data to a selected memory cell MCs (for example, write voltage Vwd) and the condition required for writing "1" data to the selected memory cell MCs. Therefore, data write is easy to control.

Further, since the variation in the characteristics of the sub memory cells SMCa and SMCb is suppressed, the resistances which the sub memory cell SMCa has in the low resistance state and in the high resistance state are very close to and are, for example, substantially the same as the resistances which the sub memory cell SMCb has in the low resistance state and in the high resistance state. This suppresses the difference between the condition required for reading "0" data from a selected memory cell MCs (for example, read potential Vread) and the condition required for reading "1" data from the selected memory cell MCs. Therefore, data read is easy to control.

3.3. Modification

The variable resistance memory device 1c of the third embodiment uses the 2MTJ-per-cell method. Therefore, the third embodiment can be combined with the second embodiment, and the combination produces the same advantages as the second embodiment.

4. Fourth Embodiment

The fourth embodiment differs from the first and third embodiments in terms of the structure of the memory cell array. In the description below, the differences from the third embodiment will be mainly described.

4.1. Configuration

The variable resistance memory device 1 of the fourth embodiment may be hereinafter referred to as a variable resistance memory device 1d in order to distinguish it from the variable resistance memory devices 1 of the first and third embodiments. The variable resistance memory device 1 includes a memory cell array 11 different from the memory cell arrays 11 of the first and third embodiments. The memory cell array 11 of the fourth embodiment may be hereinafter referred to as a memory cell array 11d in order to distinguish it from the memory cell arrays 11 of the first and third embodiments.

Figure 25:
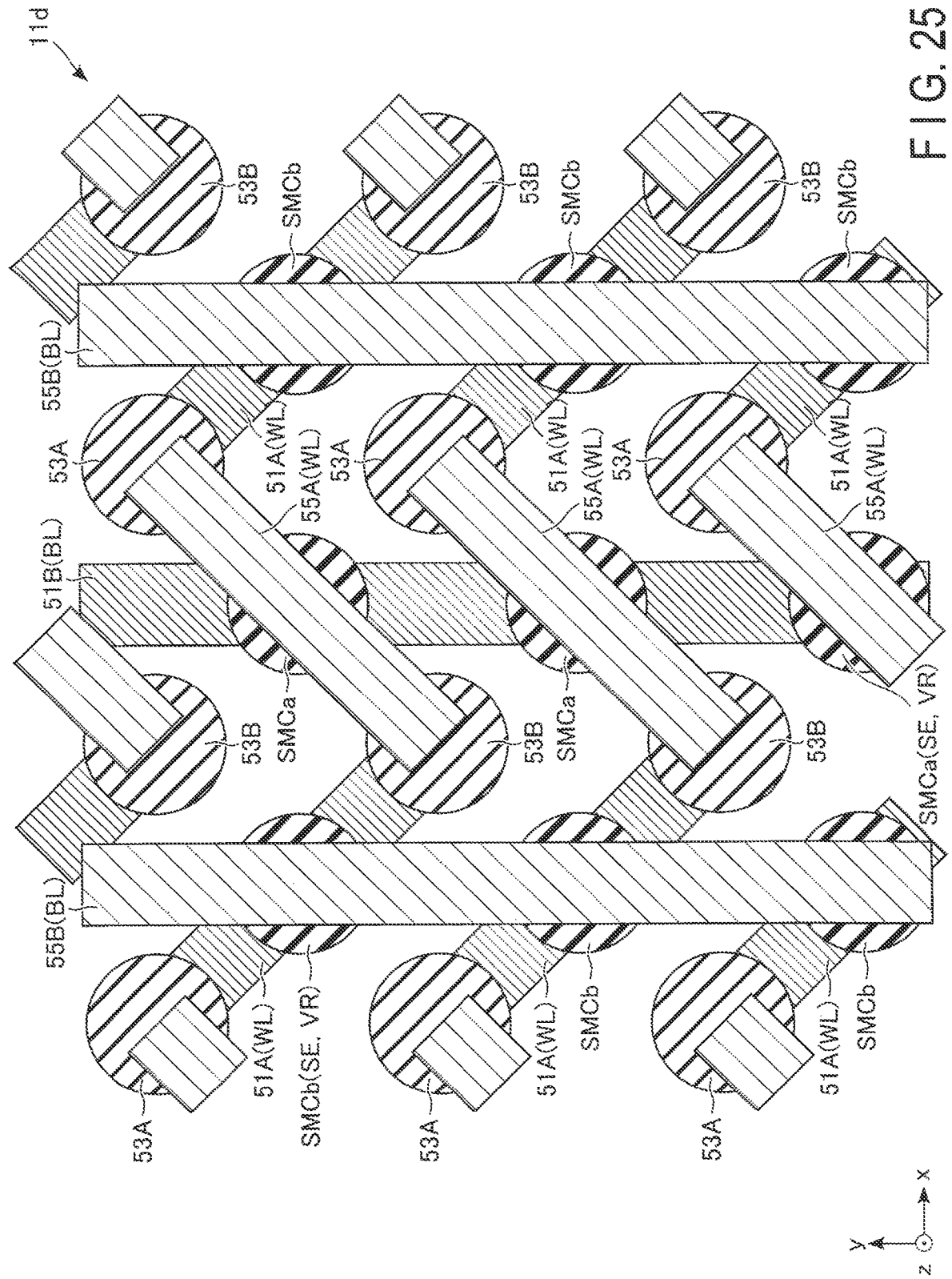
FIG. 25 shows a partial plan configuration of a memory cell array of a fourth embodiment.

FIG. 25 shows a partial plan structure of the memory cell array 11d of the fourth embodiment. FIG. 25 shows structure along an xy plane. FIG. 25 includes hatched components to facilitate visual distinction of the components. It should be noted that hatching is used only for distinguishing the components, and the materials of the components are not specified or limited to those indicated by the hatching patterns.

As shown in FIG. 25, the sub memory cells SMC (SMCa and SMCb) are not arranged with the contact plugs 53 (53A and 53B) along the x-axis or along the y-axis. Specifics of this will be described. Some contact plugs 53 are arranged along the x-axis, and a plurality of sets of contact plugs 53 arranged along the x-axis are arranged along the y-axis. Further, some contact plugs 53 are arranged along the y-axis, and a plurality of sets of contact plugs 53 arranged along the y-axis are arranged along the x-axis. That is, the contact plugs 53 are arranged in a matrix. Each row of the contact plugs 53 of the matrix of contact plugs 53 (i.e., a set of contact plugs 53 arranged along the x-axis) includes alternating contact plugs 53A and 53B. The matrix of contact plugs 53 includes a plurality of columns of contact plugs 53A (i.e., a set of contact plugs 53A arranged along the y-axis) and a plurality of columns of contact plugs 53B. The columns of contact plugs 53A and the columns of contact plugs 53B alternate along the x-axis.

Each column of sub memory cells SMC is located between a single column of contact plugs 53A and a single column of contact plugs 53B. For example, each column of sub memory cells SMC is located at the midpoint of the two columns of contact plugs 53. The columns of contact plugs 53A and the columns of contact plugs 53B alternate along the x-axis. A column of contact plugs 53B is located on the left side of a column of sub memory cells SMCa, and a column of contact plugs 53A is located on the right side of the column of sub memory cells SMCa. A column of contact plugs 53A is located on the left side of a column of sub memory cells SMCb, and a column of contact plugs 53B is located on the right side of the column of sub memory cells SMCa.

Some sub memory cells SMC are arranged along the x-axis. Each row of sub memory cells SMC (i.e., a set of sub memory cells SMC arranged along the x-axis) includes alternating sub memory cells SMCa and SMCb. Each row of sub memory cells SMC is between the two rows of contact plugs 53, as viewed along the y-axis. For example, each row of sub memory cells SMC is located at the midpoint of the two rows of contact plugs 53.

With the above arrangement, the sub memory cells SMC are arranged in a matrix.

The sub memory cells SMCa and SMCb and the contact plugs 53A and 53B arranged as above are electrically coupled to the conductors 51A and 51B, as described in connection with the third embodiment. Specifics of this will be described.

Each conductor 51A is coupled to the bottom faces of a single contact plug 53A, a single sub memory cell SMCb and a single contact plug 53B, as in the third embodiment.

To this end, each conductor 51A extends along a single contact plug 53A, a single sub memory cell SMCb and a single contact plug 53B. Each conductor 51A extends between an area below, as viewed along the z-axis, the contact plug 53A coupled to that conductor 51A and an area below, as viewed along the z-axis, the contact plug 53B coupled to that conductor 51A. Each conductor 51A extends, for example, along an axis rotated 45° clockwise from the x-axis.

Each conductor 55A is coupled to the upper faces of a single contact plug 53B, a single sub memory cell SMCa and a single contact plug 53A, as in the third embodiment. To this end, each conductor 55A extends along a single contact plug 53B, a single sub memory cell SMCa and a single contact plug 53A. Each conductor 55A extends between an area above, as viewed along the z-axis, the contact plug 53B coupled to that conductor 55A and an area above, as viewed along the z-axis, the contact plug 53A coupled to that conductor 55A. Each conductor 55A extends, for example, along an axis rotated 45° counterclockwise from the x-axis.

4.2. Advantages

With the structure of the memory cell array 11d of the fourth embodiment, it is possible to configure a circuit that is described with reference to FIG. 3 in connection with the first embodiment. Therefore, the 2MTJ-per-cell method can be realized by the fourth embodiment as well, and data can be read without depending on the MR ratio of the MTJ element VR, for the same reason as described in connection with the first embodiment.

According to the fourth embodiment, the sub memory cells SMCa and SMCb are derived from the same set of stacked components and are formed by the same series of processes, as in the third embodiment. Therefore, the same advantages as those of the third embodiment are attained.

Further, according to the fourth embodiment, the contact plugs 53 and the sub memory cells SMC do not form rows extending along the x-axis or columns extending along the y-axis. The rows of the contact plugs 53 and the rows of the sub memory cell SMC are arranged alternately, and the columns of the contact plugs 53 and the columns of the sub memory cells SMC are arranged alternately. Therefore, each sub memory cell SMC is located in the center of the four contact plugs 53 located at the vertices of a square, and each contact plug 53 is located in the center of the four sub memory cells SMC located at the vertices of a square. With this arrangement, the sub memory cells SMC and the contact plugs 53 can be arranged at high density. Assuming that the conductors 51 and 55 of the third and fourth embodiments are formed with the smallest feasible dimensions of line and space patterns, the contact plugs 53 and the sub memory cells SMC can be arranged at a higher density in the fourth embodiment than in the third embodiment.

5. Fifth Embodiment

The fifth embodiment differs from the first, third and fourth embodiments in terms of the structure of the memory cell array. In the description below, the differences from the third embodiment will be mainly described.

5.1. Configuration

The variable resistance memory device 1 of the fifth embodiment may be hereinafter referred to as a variable resistance memory device 1e in order to distinguish it from the variable resistance memory devices 1 of the first, third and fourth embodiments. The variable resistance memory device 1 includes a memory cell array 11 different from the memory cell arrays 11 of the first, third and fourth embodiments. The memory cell array 11 of the fifth embodiment may be hereinafter referred to as a memory cell array 11e in order to distinguish it from the memory cell arrays 11 of the first, and third and fourth embodiments.

Figure 26:
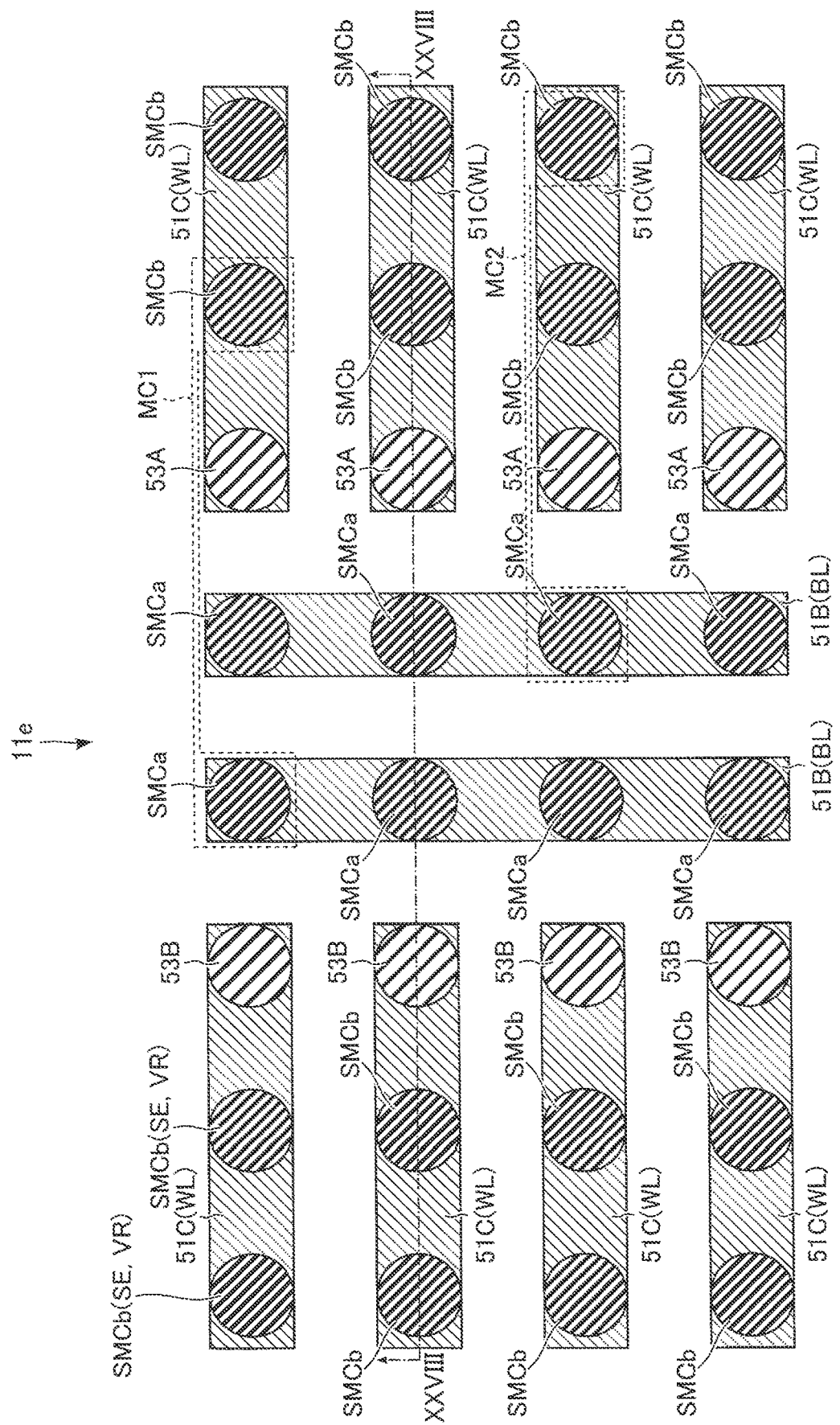
FIG. 26 shows a partial plan structure of a memory cell array of a fifth embodiment.
Figure 27:
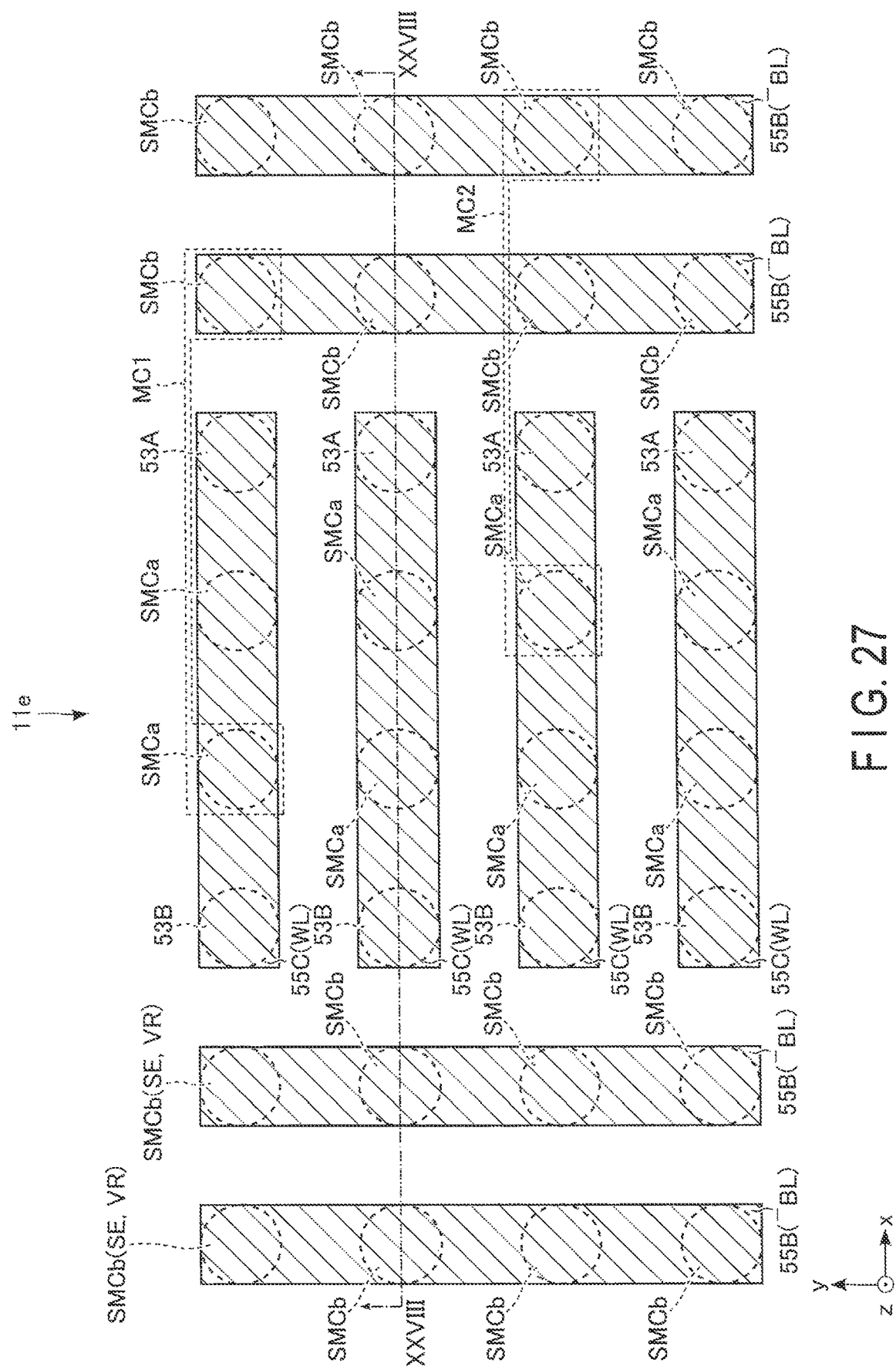
FIG. 27 shows a partial plan structure of the memory cell array of the fifth embodiment.

FIGS. 26 and 27 show a partial planar structure of the memory cell array 11e of the fifth embodiment. FIGS. 26 and 27 show structure along an xy plane and show the same region in the xy plane. FIGS. 26 and 27 show a plurality of layers arranged along the z-axis. FIG. 27 shows one of the layers shown in FIG. 26 and a layer above the layer shown in FIG. 26. FIGS. 26 and 27 include hatched components to facilitate visual distinction of the components. It should be noted that hatching is used only for distinguishing the components, and the materials of the components are not specified or limited to those indicated by the hatching patterns.

The memory cell array 11e is similar to the memory cell array 11d of the third embodiment. In the fourth embodiment, a single sub memory cell SMC is provided between the contact plugs 53A and 53B arranged along the x-axis, whereas in the fifth embodiment, two sub memory cells SMC are provided between the contact plugs 53A and 53B arranged along the x-axis.

As shown in FIG. 26, the conductors 51 include conductors 51B and conductors 51C. The conductors 51C extend along the x-axis and are spaced apart along the y-axis. Each conductor 51C functions as at least part of a single word line WL.

Each conductor 51B is located between a set of conductors 51C arranged along the y-axis and another set of conductors 51C arranged along the y-axis. Two conductors 51B are provided between the two conductors 51C arranged along the x-axis.

Each of the contact plugs 53A overlaps a single conductor 51C at least partially, and is located directly above the conductor 51C as viewed along the z-axis. Each contact plug 53A overlaps a single conductor 51C at the left end of the conductor 51C. Each contact plug 53B overlaps a single conductor 51C at least partially, and is located directly above the conductor 51C as viewed along the z-axis. The contact plug 53B overlaps a single conductor 51C at the right end of the conductor 51C.

Each set of two sub memory cells SMCa is located between a contact plug 53B and a contact plug 53A, and is arranged, for example, with a contact plug 53B and a contact plug 53A arranged along the x-axis.

Each sub memory cell SMCb overlaps a single conductor 51C at least partially, and is located directly above the conductor 51C as viewed along the z-axis. Each conductor 51C and two (or, paired) sub memory cells SMCb overlap at least partially. Each pair of sub memory cells SMCb is located between a contact plug 53A and a contact plug 53B. For example, a contact plug 53A, two sub memory cells SMCb and a contact plug 53B are arranged along the x-axis. Some sub memory cells SMCb are spaced apart along the y-axis.

Each set of four sub memory cells SMC consisting of two (or, paired) sub memory cells SMCa arranged along the x-axis and two (or, paired) sub memory cells SMCb arranged side by side with the pair of sub memory cells SMCa via a contact plug 53, constitutes two memory cells MC. Specifically, a sub memory cell SMCa which is on the first side (e.g., the left side) of the pair of sub memory cell SMCa and a sub memory cell SMCb which is on the first side of the pair of sub memory cells SMCb arranged side by side with the pair of sub memory cells SMCa via the contact plug 53 constitute a single memory cell MC1. A sub memory cell SMCa which is on the second side (e.g., the right side) of the pair of sub memory cell SMCa and a sub memory cell SMCb which is on the second side of the pair of sub memory cell SMCb arranged side by side with the pair of sub memory cells SMCa via the contact plug 53 constitute a single memory cell MC2.

As shown in FIG. 27, the conductors 55 include conductors 55B and conductors 55C. The conductors 55C extend along the x-axis and are spaced apart along the y-axis. Each conductor 55C partially overlaps a single contact plug 53B, two sub memory cells SMCa and a single contact plug 53A that are arranged along the x-axis. For example, each conductor 55C is located directly above a single contact plug 53B, two sub memory cells SMCa and a single contact plug 53A that are arranged along the x-axis, and is spaced therefrom along the z-axis. Each conductor 55C functions as at least part of a single word line WL.

The conductors 55B are located between a set of conductors 55C arranged along the y-axis and another set of conductors 55C arranged along the y-axis. Two conductors 55B are provided between the two conductors 55C arranged along the x-axis.

Figure 28:
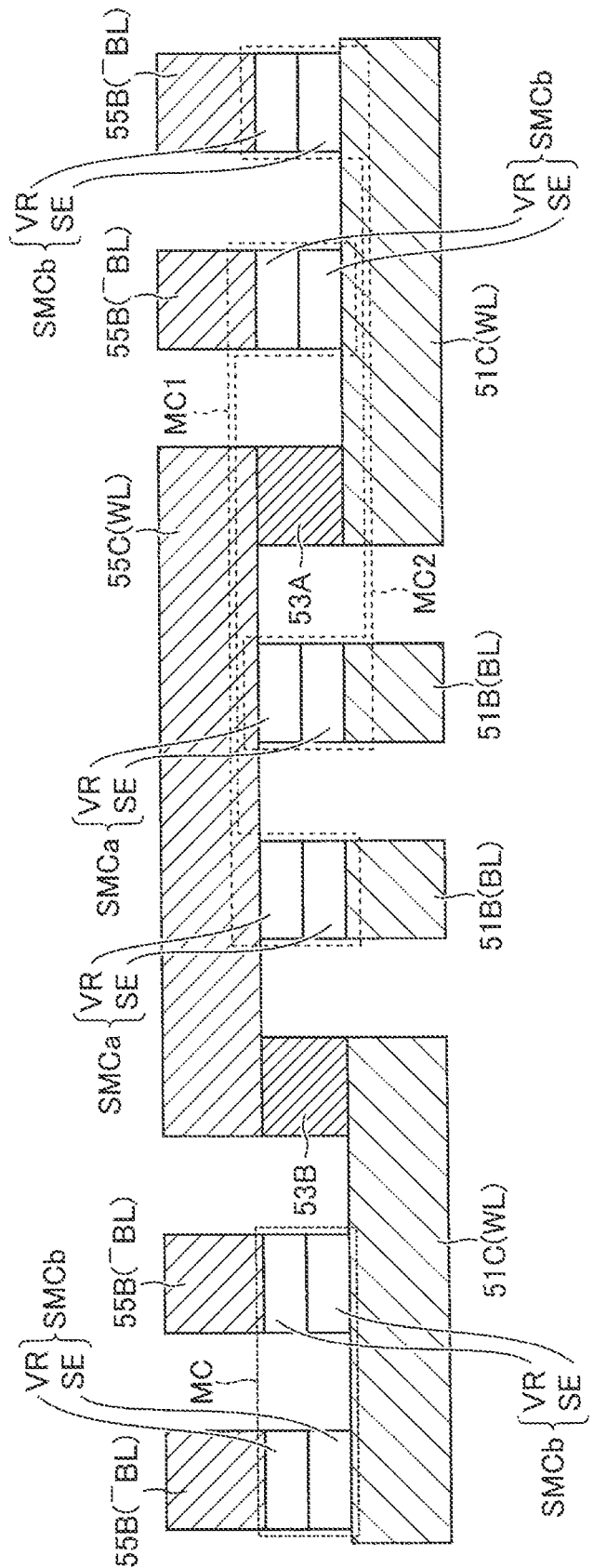
FIG. 28 shows a partial cross-sectional structure of the memory cell array of the fifth embodiment.

FIG. 28 shows a partial cross-sectional structure of the memory cell array 11e of the fifth embodiment. FIG. 28 shows a cross section taken along the line XXVIII-XXVIII of FIGS. 26 and 27.

A single conductor 51C and a set of two conductors 51B alternate along the x-axis in the bottom layer shown in FIG. 28, as shown in FIG. 28 and as described with reference to FIGS. 26 and 27. The conductors 51B and 51C are derived from the same conductor. That is, the conductors 51B and 51C are formed by partially removing a conductor that expands in the xy plane such that the conductors 51B and 51C remain.

The contact plugs 53A and 53B and the sub memory cells SMCa and SMCb are located one layer above the layer where the conductors 51B and 51C are provided. Each set consisting of a single contact plug 53A, two sub memory cells SMCb and a single contact plug 53B is located on the upper face of one conductor 51C Each sub memory cell SMCa is located on the upper face of a single conductor 51B.

The conductors 55B and 55C are located in one layer above the layer where the contact plugs 53A and 53B and the sub memory cells SMCa and SMCb are provided. The bottom face of each conductor 55C is in contact with the upper faces of a single contact plug 53B, two sub memory cells SMCa and a single contact plug 53A.

5.2. Advantages

With the structure of the memory cell array 11e of the fifth embodiment, it is possible to configure a circuit that is described with reference to FIG. 3 in connection with the first embodiment. Therefore, the 2MTJ-per-cell method can be realized by the fifth embodiment as well, and data can be read without depending on the MR ratio of the MTJ element VR, for the same reason as described in connection with the first embodiment.

According to the fifth embodiment, the sub memory cells SMCa and SMCb are derived from the same set of stacked components and are formed by the same series of manufacturing processes, as in the third embodiment. Therefore, the same advantages as those of the third embodiment are attained.

Further, in the fifth embodiment, two sub memory cells SMC are arranged along the x-axis between a contact plug 53A and a contact plug 53B. With this arrangement, the sub memory cells SMC can be arranged at high density. Assuming that the conductors 51 and 55 of the third and fifth embodiments are formed with the smallest feasible dimensions of line and space patterns, the contact plugs 53 and the sub memory cells SMC can be arranged at a higher density in the fifth embodiment than in the third embodiment in which a single sub memory cell SMC is provided between the contact plugs 53A and 53B arranged along the x-axis.

6. Sixth Embodiment

The sixth embodiment differs from the first, third, fourth and fifth embodiments in terms of the configuration of the memory cell array. In the description below, the differences from the fifth embodiment will be mainly described.

6.1. Configuration

The variable resistance memory device 1 of the sixth embodiment may be hereinafter referred to as a variable resistance memory device if in order to distinguish it from the variable resistance memory devices 1 of the first, third, fourth and fifth embodiments. The variable resistance memory device 1 includes a memory cell array 11 different from the memory cell arrays 11 of the first, third fourth and fifth embodiments. The memory cell array 11 of the sixth embodiment may be hereinafter referred to as a memory cell array 11f in order to distinguish it from the memory cell arrays 11 of the first, third, fourth and fifth embodiments.

The sixth embodiment lies in expansion of the fifth embodiment. That is, in the sixth embodiment, four sub memory cells SMC are provided between the contact plugs 53A and 53B arranged along the x-axis.

FIGS. 29 and 30 show part of structure of the memory cell array 11f of the sixth embodiment. FIGS. 29 and 30 show structure along an xy plane and show the same region in the xy plane. FIGS. 29 and 30 show a plurality of layers arranged along the z-axis. FIG. 30 shows one of the layers depicted in FIG. 29 and a layer located above the layer depicted in FIG. 29. FIGS. 29 and 30 include hatched components to facilitate visual distinction of the components. It should be noted that hatching is used only for distinguishing the components, and the materials of the components are not specified or limited to those indicated by the hatching patterns.

As shown in FIG. 29, four conductors 51B are provided between every two conductors 51C arranged along the x-axis.

Each set of four sub memory cells SMCa is located between a contact plug 53B and a contact plug 53A, and is arranged, for example, with a contact plug 53B and a contact plug 53A along the x-axis.

Each conductor 51C and four sub memory cells SMCb of a single set overlap. Each set of sub memory cells SMCb is located between a contact plug 53A and a contact plug 53B. For example, a contact plug 53A, four sub memory cells SMCb and a contact plug 53B are arranged along the x-axis. Some sub memory cells SMCb are spaced apart along the y-axis.

Each set of eight sub memory cells SMC consisting of four (or, a single set of) sub memory cells SMCa arranged along the x-axis and four (or, a single set of) sub memory cells SMCb arranged side by side with the set of sub memory cells SMCa via a contact plug 53 constitutes four memory cells MC. Specifically, a single sub memory cell SMCa which is on the first side (e.g., the leftmost side) of the set of sub memory cells SMCa and a single sub memory cell SMCb which is the first one on the first side of the set of sub memory cells SMCb arranged side by side with the set of sub memory cells SMCa via the contact plug 53 constitute a single memory cell MC1. A single sub memory cell SMCa which is the second one on the first side of the set of sub memory cells SMCa and a single sub memory cell SMCb which is the second one on the first side of the set of sub memory cells SMCb arranged side by side with the set of sub memory cells SMCa via a contact plug 53 constitute a single memory cell MC2. A single sub memory cell SMCa which the third one on the first side of the set of sub memory cells SMCa and a single sub memory cell SMCb which is the third one on the first side of the set of sub memory cells SMCb arranged side by side with the set of sub memory cells SMCa via a contact plug 53 constitute a single memory cell MC3. A single sub memory cell SMCa which is the fourth one on the first side of the set of sub memory cells SMCa and a single sub memory cell SMCb which is the fourth one on the first side of the set of sub memory cells SMCb arranged side by side with the set of sub memory cells SMCa via a contact plug 53 constitute a single memory cell MC4.

As shown in FIG. 30, each conductor 55C partially overlaps a single contact plug 53B, four sub memory cells SMCa and a single contact plug 53A that are arranged along the x-axis. For example, each conductor 55C is located directly above a single contact plug 53B, four sub memory cells SMCa and a single contact plug 53A that are arranged along the x-axis as viewed along the z-axis.

Four conductors 55B are provided between every two conductors 55C arranged along the x-axis.

Figure 31:
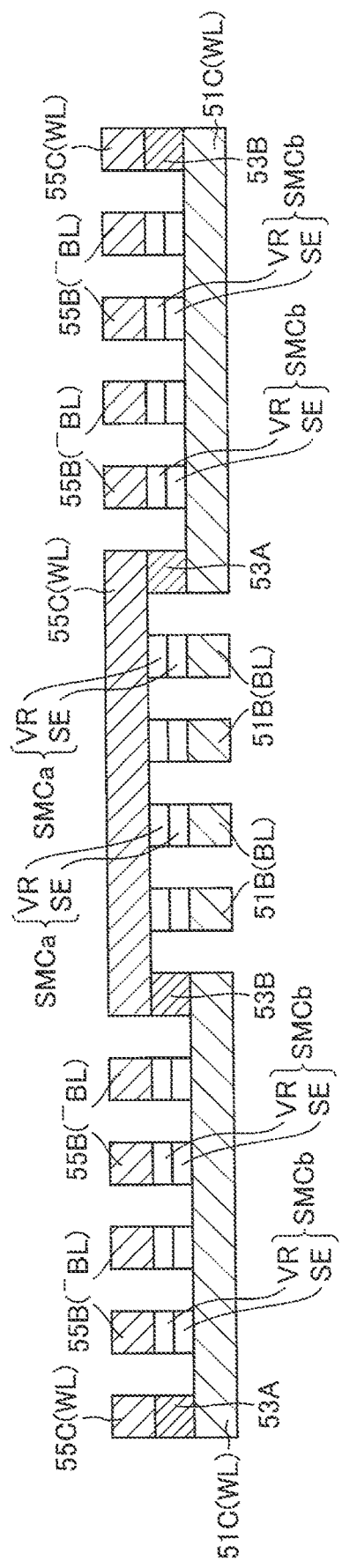
FIG. 31 shows a partial cross-sectional structure of the memory cell array of the sixth embodiment.

FIG. 31 shows a partial cross-sectional structure of the memory cell array 11f of the fifth embodiment. FIG. 31 shows a cross section taken along the line XXXI-XXXI of FIGS. 29 and 30.

A single conductor 51C and a set of four conductors 51B alternate along the x-axis in the bottom layer shown in FIG. 31, as shown in FIG. 31 and as described with reference to FIGS. 29 and 30. Each set consisting of a single contact plug 53A, four sub memory cells SMCb and a single contact plug 53B is located on the upper face of a single conductor 51C. The bottom face of each conductor 55C is in contact with the upper faces of a single contact plug 53B, four sub memory cells SMCa and a single contact plug 53A.

6.2. Advantages

With the structure of the memory cell array 11f of the sixth embodiment, it is possible to configure a circuit that is described with reference to FIG. 3 in connection with the first embodiment. Therefore, the 2MTJ-per-cell method can be realized by the sixth embodiment as well, and data can be read without depending on the MR ratio of the MTJ element VR, for the same reason as described in connection with the first embodiment.

According to the sixth embodiment, the sub memory cells SMCa and SMCb are derived from the same set of stacked components and are formed by the same series of manufacturing processes, as in the third embodiment. Therefore, the same advantages as those of the third embodiment are attained.

Further, in the sixth embodiment, four sub memory cells SMC are arranged along the x-axis between a single contact plug 53A and a single contact plug 53B. With this arrangement, the sub memory cells SMC can be arranged at high density. The contact plugs 53 and the sub memory cells SMC can be arranged at a higher density in the sixth embodiment than in the fifth embodiment in which two sub memory cells SMC are provided between the contact plugs 53A and 53B arranged along the x-axis.

6.3. Modification

Five or more sub memory cells SMC can be arranged between a contact plug 53A and a contact plug 53B. With this arrangement, the contact plugs 53 and the sub memory cells SMC can be arranged at high density.

7. Modification

In each sub memory cell SMC, a selector SE may be located on the upper face of a variable resistance element VR.

Where the variable resistance element VR is an MTJ element, the ferromagnetic layers 41 may be located above the ferromagnetic layers 43, with an insulating layer 42 interposed therebetween.

The variable resistance element VR may be an element other than the MTJ element. Such an element may be a phase change element or a ferroelectric element. The phase change element is used in a phase change RAM (PCRAM), contains chalcogenide and the like, switches between a crystalline state and an amorphous state by the heat generated by a write current, and exhibits different resistance values accordingly. Alternatively, the variable resistance element VR may include a metal oxide or a perovskite oxide, and may include an element used for resistive RAM (ReRAM). In this type of variable resistance element VR, the resistance value of the variable resistance element VR varies depending upon different widths of write pulses (or, pulse application duration), different amplitudes (a current value or a voltage value) and different polarities of write pulses (or, a direction of application).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A variable resistance memory device comprising:
    a plurality of first conductors extending in a first direction and spaced from each other in a second direction intersecting the first direction;
    a plurality of second conductors extending in the second direction and spaced from each other in the first direction;
    a plurality of third conductors extending in the first direction and spaced from each other in the second direction;
    a plurality of memory cells, each memory cell being between one first conductor and one third conductor in a third direction orthogonal to the first and second directions, and each memory cell comprising:
        a first sub memory cell between the one first conductor and one second conductor, the first sub memory cell including a first variable resistance element and a first bidirectional switching element; and
        a second sub memory cell between the one second conductor and the one third conductor, the second sub memory cell including a second variable resistance element and a second bidirectional switching element; and
    a write circuit configured to write data to one selected memory cell and output a first potential, a second potential different from the first potential, and a third potential having a magnitude between magnitudes of the first potential and the second potential,
    wherein:
        the first potential is applied to the one first conductor and the one third conductor of the one selected memory cell,
        the second potential is applied to the one second conductor of the one selected memory cell, and
        the third potential is applied to the first and third conductors of non-selected memory cells.

2. The variable resistance memory device according to claim 1, wherein the write circuit includes:
    a first potential generator configured to output the first potential;
    a second potential generator configured to output the second potential; and
    a third potential generator configured to output the third potential.

3. The variable resistance memory device according to claim 1, further comprising a read circuit configured to read data from one selected memory cell and output a fourth potential and a fifth potential having a magnitude larger than a magnitude of the fourth potential.

4. The variable resistance memory device according to claim 3, wherein the read circuit includes:
    a fourth potential generator configured to output the fifth potential; and
    a sense amplifier amplifying potentials of the one first conductor and the one third conductor of the one selected memory cell.

5. The variable resistance memory device according to claim 1, further comprising:
    an amplifier circuit including:
        a first node coupled to one of the first conductors and a second node coupled to one of the third conductors;
        a first inverter including a first input coupled to the first node and a first output coupled to the second node; and
        a second inverter including a second input coupled to the second node and a second output coupled to the first node.

6. The variable resistance memory device according to claim 1, further comprising a first selector that includes a first decoder and first sets of transistors,
    wherein:
        each of the first sets of transistors includes first, second, and third transistors having respective first ends coupled to one of the second conductors, the first transistor having a second end coupled to an interconnect that receives the first potential, the second transistor having a second end coupled to an interconnect that receives the second potential, and the third transistor having a second end coupled to an interconnect that receives the third potential, and
        the first decoder is coupled to respective gates of the first, second, and third transistors of each of the first sets of transistors.

7. The variable resistance memory device according to claim 1, further comprising a second selector that includes a second decoder and second sets of transistors,
    wherein:
        each of the second sets of transistors includes fourth, fifth, and sixth transistors having respective first ends coupled to one of the first conductors and one of the third conductors, the fourth transistor having a second end coupled to an interconnect that receives the first potential, the fifth transistor having a second end coupled to an interconnect that receives the second potential, and the sixth transistor having a second end coupled to an interconnect that receives the third potential, and the second decoder is coupled to respective gates of the fourth, fifth, and sixth transistors of each of the second sets of transistors.

8. The variable resistance memory device according to claim 1, wherein:

a first subset of the non-selected memory cells is coupled to the one second conductor of the one selected memory cell, and the third potential is applied to the second conductors of a second subset of the non-selected memory cells.

9. The variable resistance memory device according to claim 3, wherein:

the fourth potential is applied to the one first conductor and the one third conductor of the one selected memory cell, the fifth potential is applied to the one second conductor of the one selected memory cell, a third subset of the non-selected memory cells is coupled to the one second conductor of the one selected memory cell, and the fourth potential is applied to the second conductors of a fourth subset of the non-selected memory cells.

* * * * *